(12) United States Patent
Cairns et al.

(10) Patent No.: US 6,404,230 B1
(45) Date of Patent: Jun. 11, 2002

(54) LEVEL-SHIFTING PASS GATE

(75) Inventors: Graham Andrew Cairns; Michael James Brownlow, both of Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/803,125

(22) Filed: Mar. 9, 2001

(30) Foreign Application Priority Data

Mar. 14, 2000 (GB) .............................. 0005985

(51) Int. Cl.$^7$ .......................................... H03K 19/0175

(52) U.S. Cl. ............................ 326/68; 326/113; 326/81

(58) Field of Search ............................. 326/56–58, 68, 326/81, 112, 119, 121, 113

(56) References Cited

U.S. PATENT DOCUMENTS 5,894,227 A  *  4/1999  Acuff .......................... 326/68
6,160,421 A  * 12/2000  Barna .......................... 326/63

OTHER PUBLICATIONS

British Search Report, Application No. GB 0005985.7, dated Apr. 28,2000.

* cited by examiner

*Primary Examiner*—Michael Tokar
*Assistant Examiner*—Anh Tran
(74) *Attorney, Agent, or Firm*—Renner, Otto, Boisselle & Sklar

(57) ABSTRACT

A level-shifting pass gate comprises a field effect transistor (M1) whose source is connected to a signal input (IN) and whose drain is connected to a signal output (OUT). A load (R) is connected between the drain of the transistor (M1) and a supply line (vdd). A control means (1) has an enable input (EN) which receives signals for enabling or disabling the pass gate. When the gate is enabled, the control means (1) controls the transistor (M1) and possibly the load (R) so that an input logic low level is passed substantially unchanged whereas a relatively low input high level is shifted to a higher output logic high level approaching the supply voltage. When the pass gate is disabled, the transistor (M1) is switched off so that the input (IN) is isolated from the output (OUT) and assumes a high impedance state. Conversely, when disabled, the output (OUT) defaults to a predetermined state, such as logic low, logic high or high impedance.

32 Claims, 28 Drawing Sheets ously. When the input IN receives the higher logic level $V_{HH}$ so

LEVEL-SHIFTING PASS GATE

BACKGROUND OF THE INVENTION

1. Field of the Invention

The present invention relates to a level-shifting pass gate.

2. Description of the Related Art

Such a gate may be embodied in the form of a metal-oxide-semiconductor (MOS) circuit for responding to input signals which are of substantially lower amplitude than the circuit supply voltage. Such circuits may be used in large-area silicon-on-insulator (SOI) circuits for interfacing with system signals of smaller voltage levels, typically in the region of 1.0 to 5.0 volts. Such circuits typically operate at significantly higher supply voltages, for example in the region of 10 to 20 volts. An example of this type of circuit is a monolithic driver for a flat-panel matrix display fabricated with poly-silicon thin-film transistors (TFTs).

FIG. 1 of the accompanying drawings illustrates a known type of level shifter as disclosed, for example, in U.S. Pat. No. 5,729,154. The circuit comprises an input stage formed by N-type MOS field effect transistors M1 and M3 and P-type field effect transistors M2 and M4. The output of this stage is connected to a conventional CMOS inverter comprising an N-type transistor M5 and a P-type transistor M6.

The gates of the transistors M2 and M4 are connected to a supply line vss so that these transistors operate substantially as resistors. The gate of the transistor M1 is connected to the gate and drain of the transistor M3, which therefore functions like a diode. The source of the transistor M3 is connected to receive a voltage Vbias which is between the voltages on the supply lines vss and vdd. The purpose of the transistor M3 is to provide a threshold voltage compensated bias voltage to the gate of the transistor M1. The source of the transistor M1 is connected to an input IN of the level shifter.

In use, the input IN receives a logic signal which switches between a lower or zero level $V_{ss}$ and an upper level $V_{HH}$ which is less than the supply voltage $V_{DD}$ on the supply line vdd. When the lower logic level $V_{SS}$ is supplied to the input IN, the gate-source voltage of the transistor M1 is large enough to ensure that the transistor M1 is turned on and the voltage of the drain is pulled down approximately to the voltage $V_{SS}$ of the supply line $V_{SS}$. The inverter formed by the transistors M5 and M6 inverts this so that the inverted output OUTB rises substantially to the supply line potential $V_{DD}$ of the supply line vdd.

When the higher logic level $V_{HH}$ is applied to the input IN, the gate-source voltage of the transistor M1 is reduced such that the transistor M1 is only weakly conducting or is turned off. The transistor M2 thus pulls the input of the inverter towards the voltage $V_{DD}$ of the supply line vdd and above the switching point of the inverter M5, M6. The output OUTB of the inverter thus falls substantially to the voltage $V_{SS}$ of the supply line vss.

Although such an arrangement provides level-shifting of input high level logic signals, the level shifter of FIG. 1 presents a lower impedance input load to whatever signal line is connected to the input IN when the input signal is at the logic low level. Thus, when output signals from the level shifter are not required, any signal line connected to the input IN may be unacceptably loaded by the low input impedance of the level shifter to low level logic signals.

FIG. 2 of the accompanying drawings illustrates another known type of level shifter, for example as disclosed in EP 0 600 734 A. This level shifter differs from than shown in FIG. 1 of the accompanying drawings in that the source of the transistor M1 is connected to a complementary input INB whereas the source of the transistor M3 is connected to the direct input IN. Also, the gates of the transistors M2 and M4 are connected to the inputs IN and INB, respectively.

When the input IN receives the higher logic level $V_{HH}$ so that the complimentary input INB is at the lower input logic level $V_{SS}$, the voltage at the gate of the transistor M1 is increased while the drive provided by the transistor M2 is reduced. Thus, the input of the inverter M5, M6 is lower than in the case of the level shifter shown in FIG. 1. Conversely, when the input IN receives the lower logic level $V_{SS}$ and the complimentary input INB receives the higher logic level $V_{HH}$, the transistor M1 is turned harder off, thus allowing the input to the inverter M5, M6 to be higher than in the case of the level shifter shown in FIG. 1. This allows a greater degree of level shifting to be achieved while making the switching point of the inverter M5, M6 less critical. However, in this case, both inputs IN and INB are connected to the sources of the transistors M1 and M2, which present a low impedance load to any signal lines connected to the inputs.

FIG. 3 of the accompanying drawings illustrates a level shifter of the type disclosed, for example, in U.S. Pat. No. 5,748,026. Complementary inputs IN and INB are connected to the sources of diode-connected N-type transistors M3 and M3', respectively, which are provided with load resistances in the form of conducting P-type transistors M4 and M4'. The bases and drains of the transistors M3 and M3' are connected to the gates of N-type transistors M1 and M1', respectively, which are provided with a current mirror load comprising P-type transistors M2 and M2'. The diode-connected transistors M3 and M3' provide level shifting of the complementary input signals by adding a bias voltage. However, again, the inputs IN and INB present a low impedance load to the signal lines to which they are connected.

FIG. 4 of the accompanying drawings illustrates a simplified version of a known level shifter also disclosed in U.S. Pat. No. 5,748,026. This arrangement differs from that shown in FIG. 3 in that the transistors M3 and M3' are of P-type and, in conjunction with the transistors M4 and M4', are connected as source-followers whereas the sources of the transistors M1 and M1' are connected to the inputs INB and IN. The transistors M3 and M3' again provide initial level shifting of the input signals but, again, the inputs IN and INB are connected to transistor sources and so present a relatively low impedance load to signal lines connected to the inputs.

SUMMARY OF THE INVENTION

According to a first aspect of the invention, there is provided a level-shifting pass gate comprising: a first circuit comprising a pass transistor, whose main conduction path is connected between a signal input and a signal output, and a load connected to the signal output; and a second circuit have an enable input and being arranged to control the first circuit such that, when an enable signal supplied to the enable input is active and a first logic level is supplied to the signal input, the pass transistor provides a level-shifted logic level at the signal output and, when the enable signal is inactive, the signal input is set to a high impedance state and the signal output is set to a pre-determined state.

The pass transistor may be arranged to provide a substantially unshifted logic level at the signal output when the enable signal is active and a second logic level is supplied to the signal input. The first logic level may have a higher magnitude than the second logic level. The magnitude of the second logic level may be substantially equal to zero.

The second circuit may be arranged to switch off the first transistor when the enable signal is inactive.

The second circuit may be arranged to supply, to a control electrode of the pass transistor, a bias voltage greater than a threshold voltage of the pass transistor when the enable signal is active. The difference between the bias voltage and the first logic level may be less than the threshold voltage of the pass transistor.

The second circuit may comprise a bias voltage source comprising a resistance connected to an output electrode and a control electrode of a first transistor. The first transistor may have a common electrode connected to ground. As an alternative, the first transistor may have a common electrode connected to receive a high voltage level when the enable signal is in active and a low voltage level when the enable signal is inactive. As a further alternative, the first transistor may have a common electrode connected to a complementary signal input.

The common electrode of the first transistor may be connected via the main conduction path of a second transistor whose control electrode is arranged to receive a further bias voltage.

The resistance may comprise the main conduction path of a third transistor. The third transistor may be arranged to be switched off when the enable signal is inactive and to be conductive when the enable signal is active.

The control and output electrodes of the first transistor may be connected to a control electrode of the pass transistor.

The gate may comprise a fourth transistor arranged to connect a control electrode of the pass transistor to ground when the enable signal is inactive.

The gate may comprise of at least one further pass transistor, the or each of which has a main conduction path connected between a respective further signal input and the signal output.

The load may comprise a substantially fixed resistance and the predetermined state may comprise a high level state.

The load may comprise a load transistor of a conductivity type opposite that of the pass transistor. The pass transistor may have a higher drive capability than the load transistor.

The load transistor may be arranged to be switched off when the enable signal is inactive. The predetermined state may be a high impedance state. As an alternative, a pull-down transistor having a main conduction path connected between the signal output and ground may be arranged to be switched on when the enable signal is inactive and the predetermined state may be a low level state.

The load transistor may be arranged to receive a fixed bias and the predetermined state may be high level state. The load transistor may have a control electrode connected to receive a ground potential.

The signal output may be connected to the input of a first inverter. The gate may comprise a second controllable inverter whose input and output are connected to the output and input, respectively, of the first inverter and which is arranged to be enabled when the enable signal is inactive and to be disabled when the enable signal is active.

The or each transistor may comprise a field effect transistor. The gate may be embodied in a CMOS integrated circuit.

According to a second aspect of the invention, there is provided a driver circuit for a matrix display including a gate in accordance with a first aspect of the invention.

It is thus possible to provide a level-shifting pass gate which is very sensitive and which permits operation with very low voltage inputs. Such a gate has a high-operating speed which allows, for example, high speed shifting or sampling to be achieved. It is easy to implement a logic AND function for any number of low voltage inputs. A lower power consumption may be achieved because of improved logic level swings. The gate is robust to process variation and may be embodied by a relatively small number of transistors.

The pass gate incorporates an enabling or gating arrangement which allows the gate to be switched to a disabled state in which the output adopts a predetermined state irrespective of the input and the input presents a high impedance to signal lines connected to it. The predetermined states can be selected according to the following circuit requirements and can be in the form, for example, of a logic low level, a logic high level or a high impedance state. By switching the input to a high impedance state when the gate is disabled, unnecessary loading of the signal line connected to the input can be substantially avoided.

BRIEF DESCRIPTION OF THE DRAWINGS

The invention will be further describe, by way of example, with reference to the accompanying drawings, in which.

Like reference numerals refer to like parts throughout the drawings.

DESCRIPTION OF THE PREFERRED EMBODIMENTS

Figure 1:
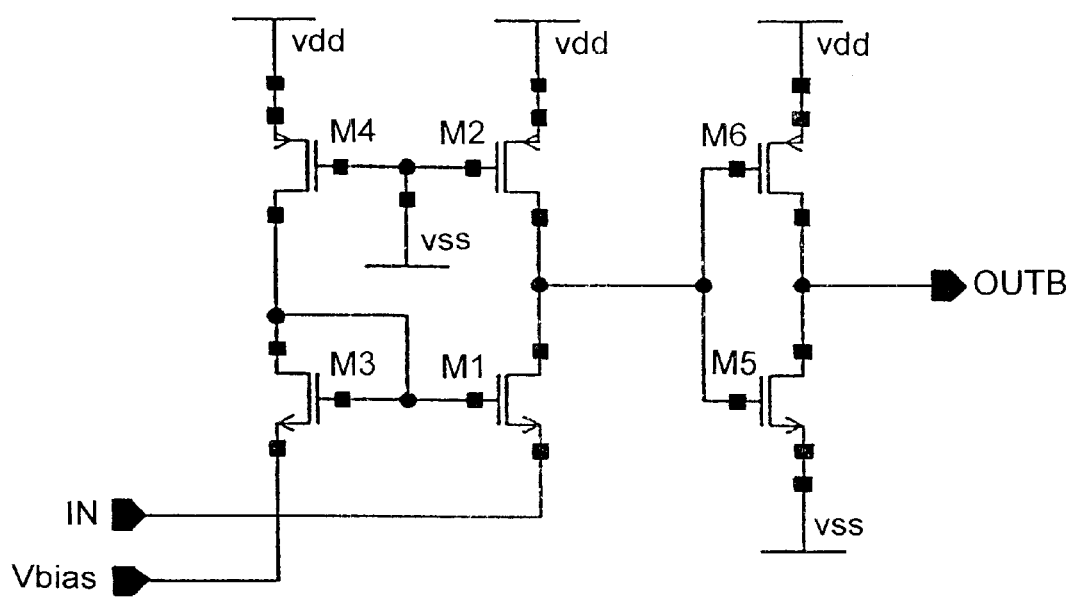
FIGS. 1 to 4 are circuit diagrams illustrating known types of level shifters.
Figure 2:
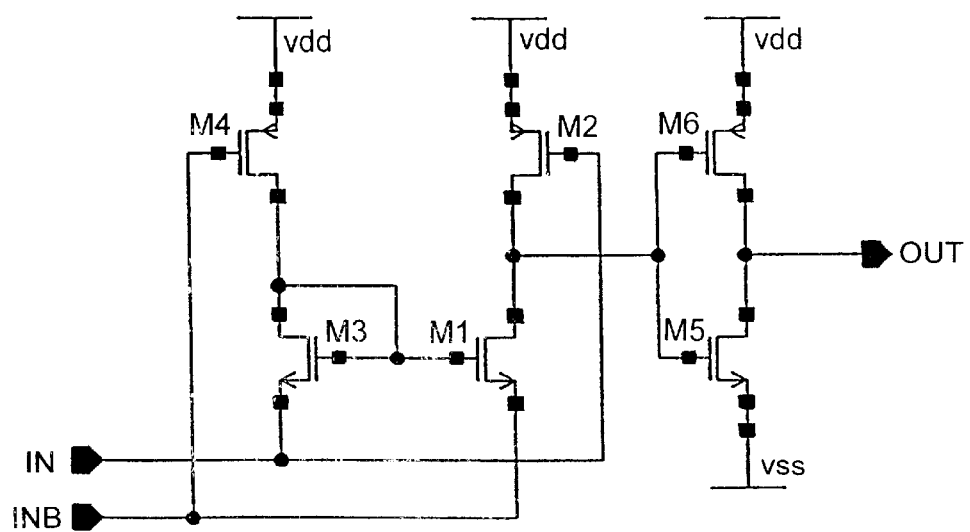
Figure 3:
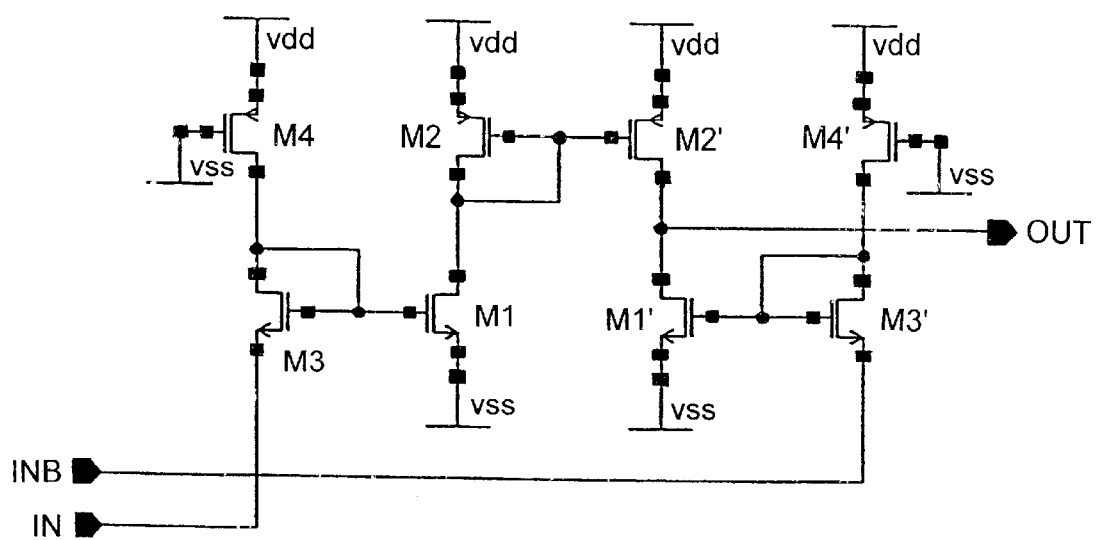
Figure 4:
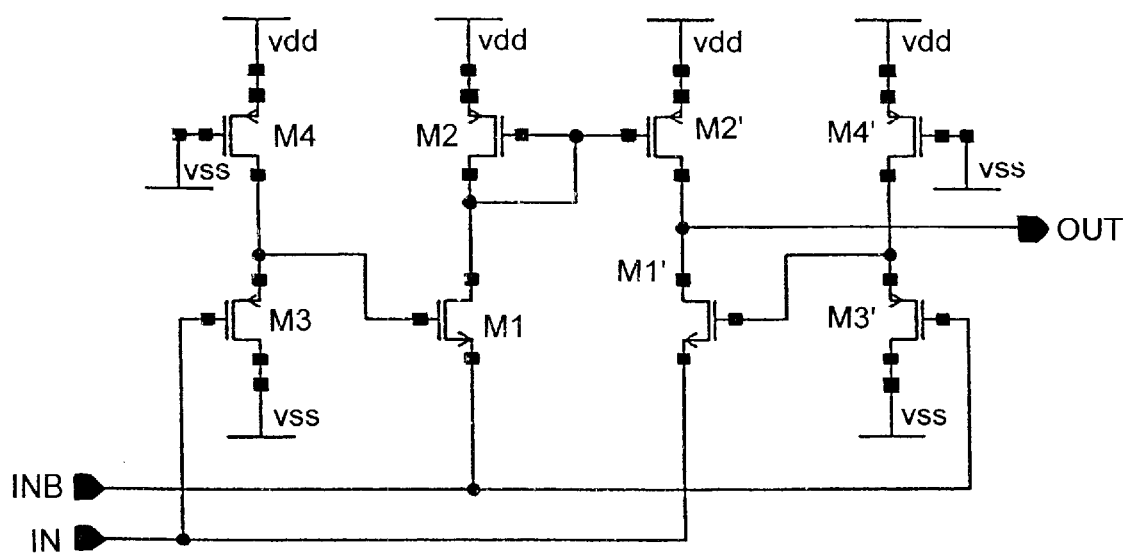
Figure 5:
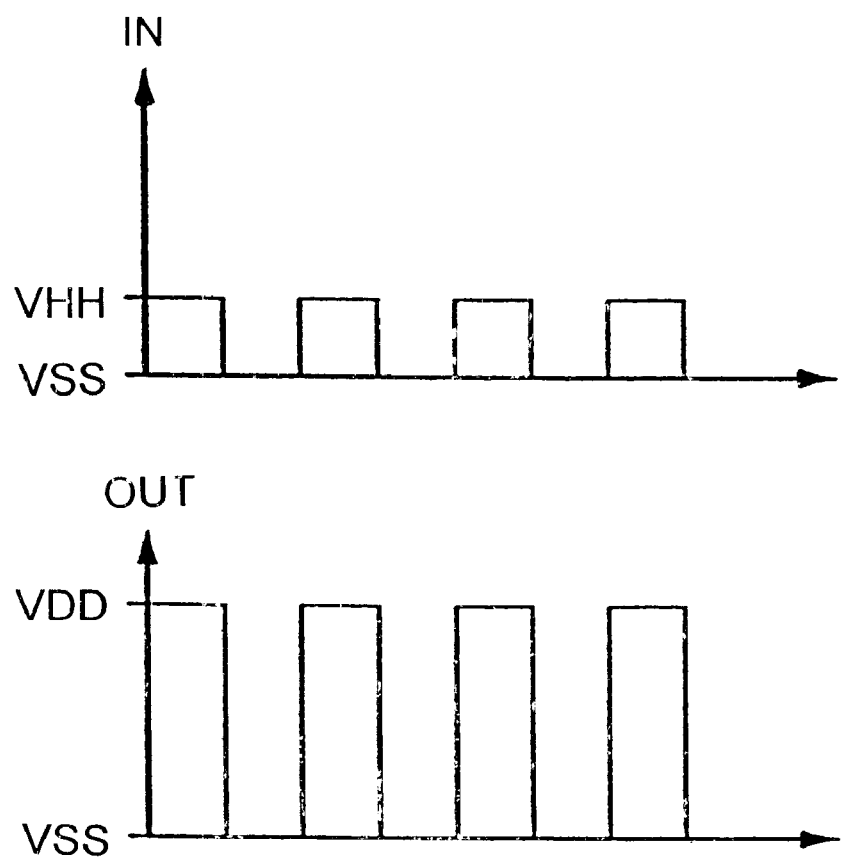
FIG. 5 is a waveform diagram illustrating a level shifting function to be performed by embodiments of the invention.

FIG. 5 illustrates the level shifting function which is required to be performed by the level-shifting pass gates constituting embodiments of the invention and described hereinafter. The upper waveform diagram in FIG. 5 illustrates a typical input signal in the form of a logic level signal having two logic levels. The lower logic level $V_{SS}$ is equal to or substantially equal to zero volts, and, as shown in the lower waveform diagram of FIG. 5, this level is not required to be changed. However, the upper input level $V_{HH}$ is a relatively low "logic" high level, for example, of the order of two volts and this level is required to be increased to the high level $V_{DD}$, for example which may be 15 volts and which corresponds to the power supply voltage of the pass gate. The level-shifting pass gate is thus required to perform the functions of a pass gate and at the same time interface between the relatively low level logic signals supplied to the input of the pass gate and subsequent circuitry connected to the output of the pass gate.

Figure 6:
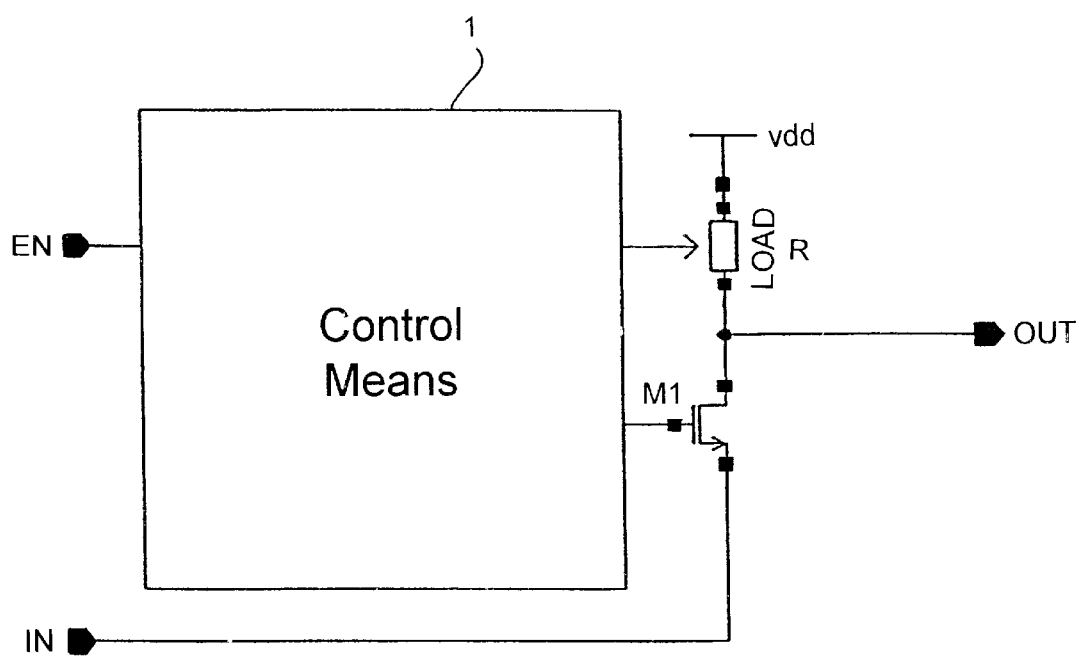
FIG. 6 is a schematic circuit diagram illustrating a level-shifting pass gate constituting a first embodiment of the invention.

The level-shifting pass gate shown in FIG. 6 comprises a pass transistor M1 (shown as an N-type MOS field effect transistor but which may equally well be of P-type) whose source is connected to a signal input IN and whose drain is connected to a signal output OUT. The drain of the transistor M1 is also connected via a load R to a power supply line vdd. The gate of the transistor M1 is connected to a control circuit or means 1 which has an enable input EN for receiving an enable signal which is illustrated in the embodiments as being of the "active high" type but which could equally well be of the active low type. A control connection is also illustrated between the control means 1 and the load R although, in some embodiments, such a connection is not provided.

The enable input EN receives a logic signal which switches between $V_{DD}$ (which is the power supply voltage on the supply line vdd) and $V_{SS}$, which is the ground potential or the voltage of a lower supply line (not shown in FIG. 6). A signal input IN receives, as described hereinbefore, a lower voltage logic signal switching between $V_{SS}$ and an upper logic level $V_{HH}$ which is substantially less then $V_{DD}$.

When the enable signal supplied to the input EN is at the low logic level, the control means 1 controls the circuit formed by the transistor M1 and the load R such that the transistor M1 is turned off and the output OUT is isolated from the input IN. In this condition, the input IN assumes a high impedance state whereas the output OUT assumes a predetermined state which may be, for example, a logic high level ($V_{DD}$), a logic low level ($V_{SS}$) or a high impedance (Z) state. The circuit behaviour of the pass gate may then be summarised by the following truth table:

| EN | IN | OUT |
|---|---|---|
| 0 ($V_{SS}$) | 0 ($V_{SS}$) | X |
| 0 ($V_{SS}$) | 1 ($V_{HH}$) | X |
| 1 ($V_{DD}$) | 0 ($V_{SS}$) | 0 ($\approx V_{SS}$) |
| 1 ($V_{DD}$) | 1 ($V_{HH}$) | 1 ($\approx V_{DD}$) |

X = 0 ($V_{SS}$), 1 ($V_{DD}$) or Z (high impedance)

When the enable signal at the input EN is high, the control means 1 ensures that a suitable bias voltage $V_{bias}$ is supplied to the gate of the transistor M1. The pass transistor M1 and the load R thus operate as a common gate amplifier with the signal supplied to the input IN controlling the gate-source voltage of the transistor M1. When a low logic level $V_{SS}$ is supplied to the input IN, the gate-source voltage $V_{GS}$ is equal to the bias voltage $V_{bias}$ so that the transistor M1 is turned on and its drain pulls the output OUT low.

Conversely, when the higher level signal $V_{HH}$ is supplied to the input IN, the gate-source voltage $V_{GS}$ is equal to $V_{bias}-V_{HH}$ so that the transistor M1 is either weakly conducting or turned completely off and the load R pulls the output OUT high.

The drive strength or capability of the transistor M1, the value of the gate bias voltage $V_{bias}$ and the impedance of the load R are chosen in order to provide large voltage swings at the output OUT. In order for the output OUT to switch between values close to the supply voltages $V_{SS}$ and $V_{DD}$ for different input conditions, the following criteria should be observed:

1. $V_{bias}$ should be greater than the threshold voltage of the transistor M1;
2. $V_{bias}-V_{HH}$ should be less than the threshold voltage of the transistor M1; and
3. the impedance of the load R should be high.

The third criterion illustrates that there is a trade-off between speed of operation and a degree of level shifting. A high impedance load R ensures that, for a low level input signal, the transistor M1 can pull the output OUT almost to the value of the input $V_{SS}$. However, for a high level input $V_{HH}$, the transistor M1 is turned off and the high impedance of the load R can only pull the output OUT to $V_{DD}$ relatively slowly.

Accordingly, for many applications, the load R does not have such a high impedance and a smaller degree of level-shifting is accepted. For lower load impedances, the second design criterion need not be observed because the load R is able to pull the output OUT to an acceptably high voltage level even when the transistor M1 is partially conducting.

Figure 7:
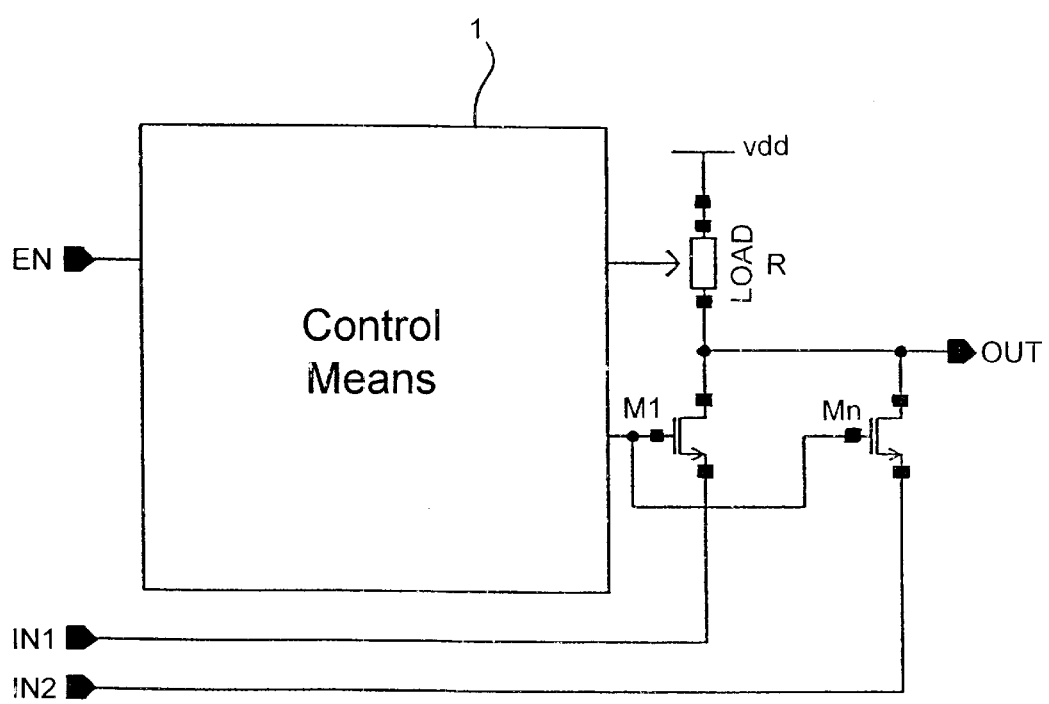
FIG. 7 is a schematic circuit diagram illustrating a pass gate of the type shown in FIG. 6 and including an AND function.

The pass gate shown in FIG. 7 is of the same type as that shown in FIG. 6 but includes a logic AND function implemented at the input thereof. The gate of FIG. 7 differs from that of FIG. 6 in that a further N-type field effect transistor Mn forms an additional pass gate with its drain and gate connected to the output OUT and the gate of the transistor M1, respectively. The gate has two inputs IN1 and IN2 connected to the sources of the transistors M1 and Mn.

When the pass gate is enabled, the output OUT is at the high logic level $V_{DD}$ only when both inputs IN1 and IN2 are at the input logic high level $V_{HH}$. If either or both input is at the logic low level $V_{SS}$, either or both transistors M1 and Mn are turned on so that the output OUT is pulled low. The operation of the circuit for different input and enable conditions is illustrated in the following truth table;

| EN | IN1 | IN2 | OUT |
|---|---|---|---|
| 0 ($V_{SS}$) | 0 ($V_{SS}$) | 0 ($V_{SS}$) | X |
| 0 ($V_{SS}$) | 0 ($V_{SS}$) | 1 ($V_{HH}$) | X |
| 0 ($V_{SS}$) | 1 ($V_{HH}$) | 0 ($V_{SS}$) | X |
| 0 ($V_{SS}$) | 1 ($V_{HH}$) | 1 ($V_{HH}$) | X |
| 1 ($V_{DD}$) | 0 ($V_{SS}$) | 0 ($V_{SS}$) | 0 ($\approx V_{SS}$) |
| 1 ($V_{DD}$) | 0 ($V_{SS}$) | 1 ($V_{HH}$) | 0 ($\approx V_{SS}$) |
| 1 ($V_{DD}$) | 1 ($V_{HH}$) | 0 ($V_{SS}$) | 0 ($\approx V_{SS}$) |
| 1 ($V_{DD}$) | 1 ($V_{HH}$) | 1 ($V_{HH}$) | 1 ($\approx V_{DD}$) |

X = 0 ($V_{SS}$), 1 ($V_{DD}$) or Z (high impedance)

Although only two inputs IN1 and IN2 and two pass transistors M1 and Mn are shown in FIG. 7, any number of inputs and transistors may be provided so as to implement an AND function having any desired number of inputs.

Figure 8:
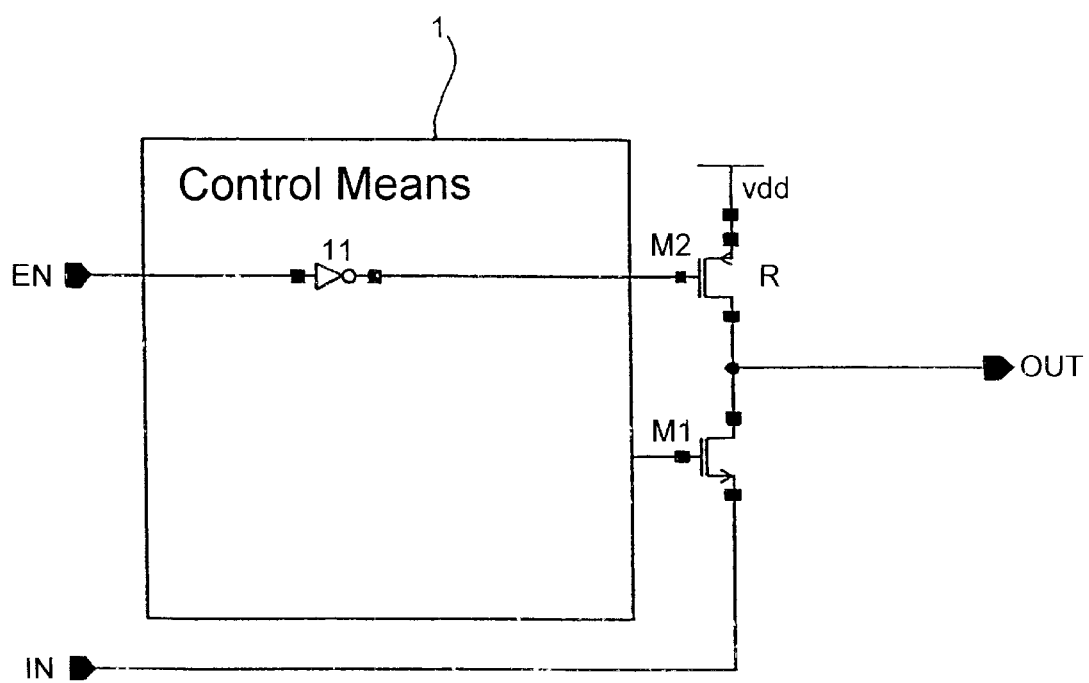
FIGS. 8 to 11 are schematic diagrams illustrating different types of loads which may be used in the pass gate of FIG. 6.

The pass gate shown in FIG. 8 illustrates one form of the load R which, in this case, is controlled by the control means 1. The load comprises a P-type field effect transistor M2 whose source is connected to the supply line vdd and whose drain is connected to the output OUT. The gate of the transistor M2 is connected to the output of an inverter I1 which forms part of the control means 1 and whose input is connected to the enable input EN.

When the enable single supplied to the enable input EN is active ie. at $V_{DD}$, the output of the inverter I1 pulls the gate of the transistor M2 substantially to the ground or lower supply line potential $V_{SS}$ so that the transistor M2 is conductive and behaves as a resistive load. The drive capability of the transistor M1 must be greater than that of the transistor M2 so that, when the input signal IN is at the low level, the transistor M1 can pull the output OUT to the low level. When the input signal is at the higher input logic level $V_{HI}$, the transistor M1 is turned off and the transistor M2 pulls the output OUT substantially to the voltage $V_{DD}$ of the supply line vdd.

When the enable signal is inactive ie. at the low logic level $V_{SS}$, the output of the inverter I1 pulls the gate of the transistor M2 substantially to the supply line voltage $V_{DD}$ so that the transistor M2 is turned off. The control means also turns off the transistor M1 so that the output OUT is in a high impedance state.

Figure 9:
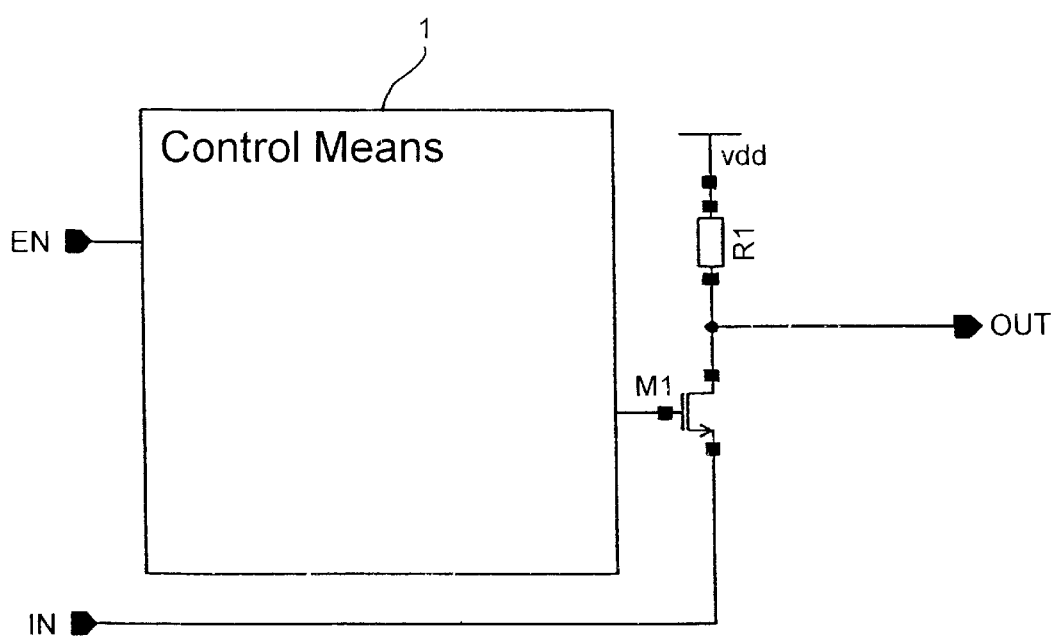

FIG. 9 illustrates a pass gate of the type in which the load is not controlled by the control means 1. In this case, the load is embodied as a resistor R1 connected between the output OUT and the supply line vdd.

When the enable signal is active, the transistor M1 pulls the output OUT to the low logic level when the input signal at the input IN is at the low logic level. When the input signal is at the input high logic level, the transistor M1 is turned off and the load R1 pulls the output OUT to the high logic level $V_{DD}$.

When the enable signal is inactive, the transistor M1 is turned off irrespective of the input signal supplied to the input IN. In this condition, the resistor R1 pulls the output OUT to the high logic level irrespective of the input signal.

Figure 10:
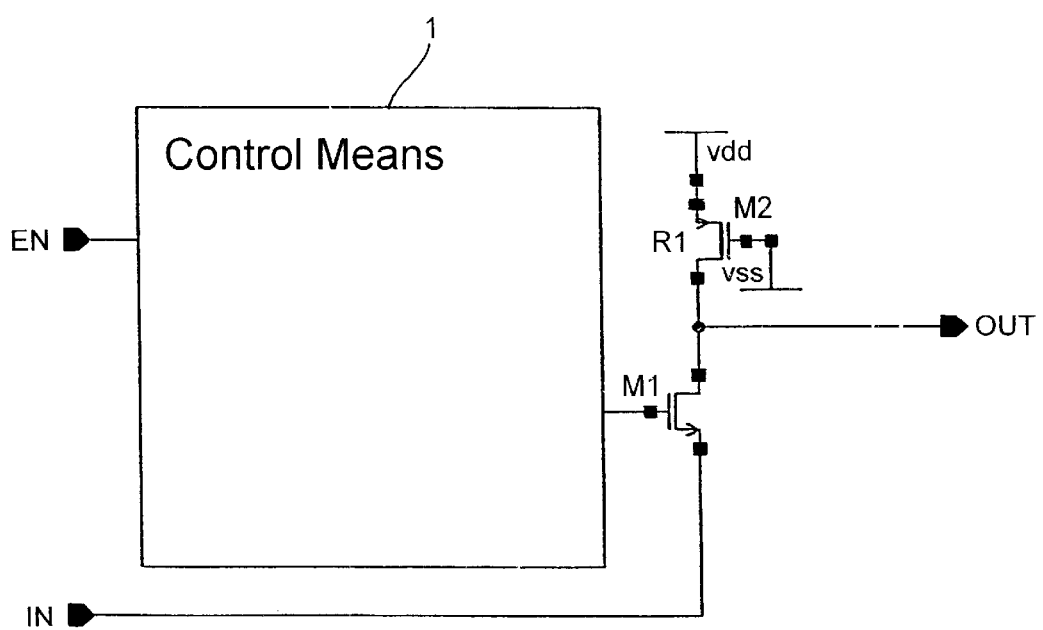

FIG. 10 illustrates an example of the pass gate of FIG. 9 in which the load resistor R1 is embodied as a P-type field effect transistor M2. The source and drain of the transistor M2 are connected to the supply line vdd and to the output OUT, respectively. The gate of the transistor M2 is connected to receive a fixed bias which, in the embodiment shown in FIG. 10, is the lower supply line vss or ground. The transistor M2 is therefore in its conductive state and acts as a resistance which, when the pass gate is disabled, pulls the output OUT to the logic high level $V_{DD}$.

Figure 11:
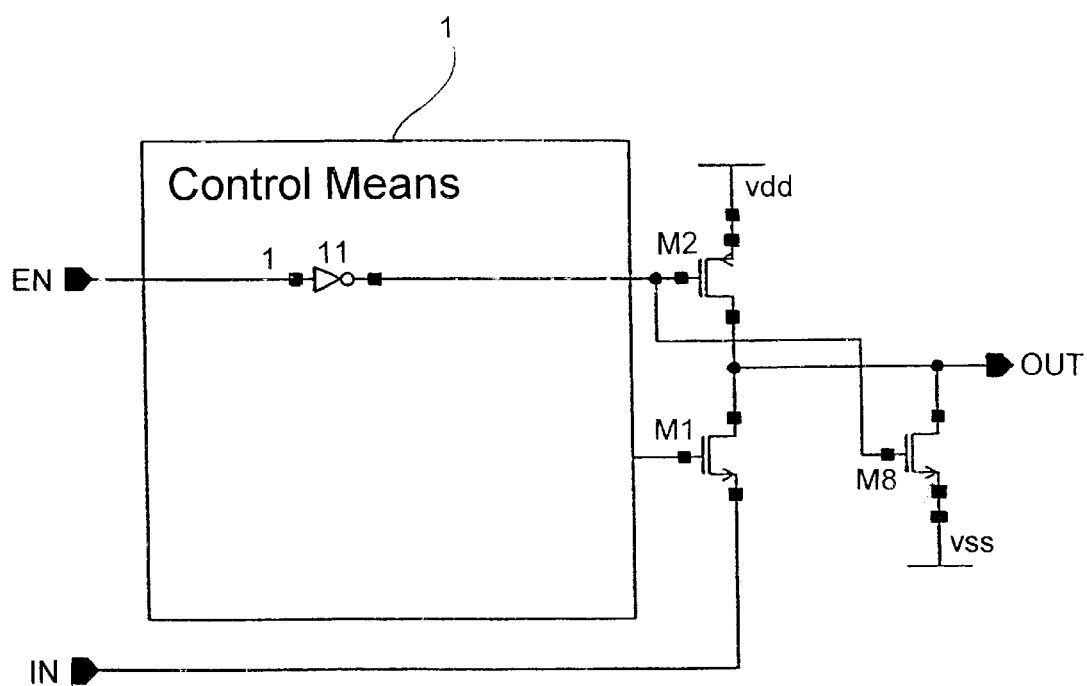

The pass gate shown in FIG. 11 differs from that shown in FIG. 8 in that an N-type pull-down field effect transistor M8 is provided with its drain connected to the output OUT, its source connected to the supply line vss and its gate connected to the output of the inverter I1 of the control means 1. When the enable signal is active, the output of the inverter I1 pulls the gate of the transistor M8 substantially to the potential $V_{SS}$ of the supply line vss so that the transistor M8 is switched off and has no effect. Thus, in this condition, the pass gate of FIG. 11 functions in exactly the same way as the pass gate of FIG. 8.

When the enable signal is inactive, the transistors M1 and M2 are turned off as in the pass gate of FIG. 8. However, in this condition, the output of the inverter I1 pulls the gate of the transistor M8 to the upper supply line potential $V_{DD}$ so that the transistor M8 is turned on. Thus, the output OUT is pulled to the ground potential $V_{SS}$ or logic low level when the gate is disabled.

Figure 12:
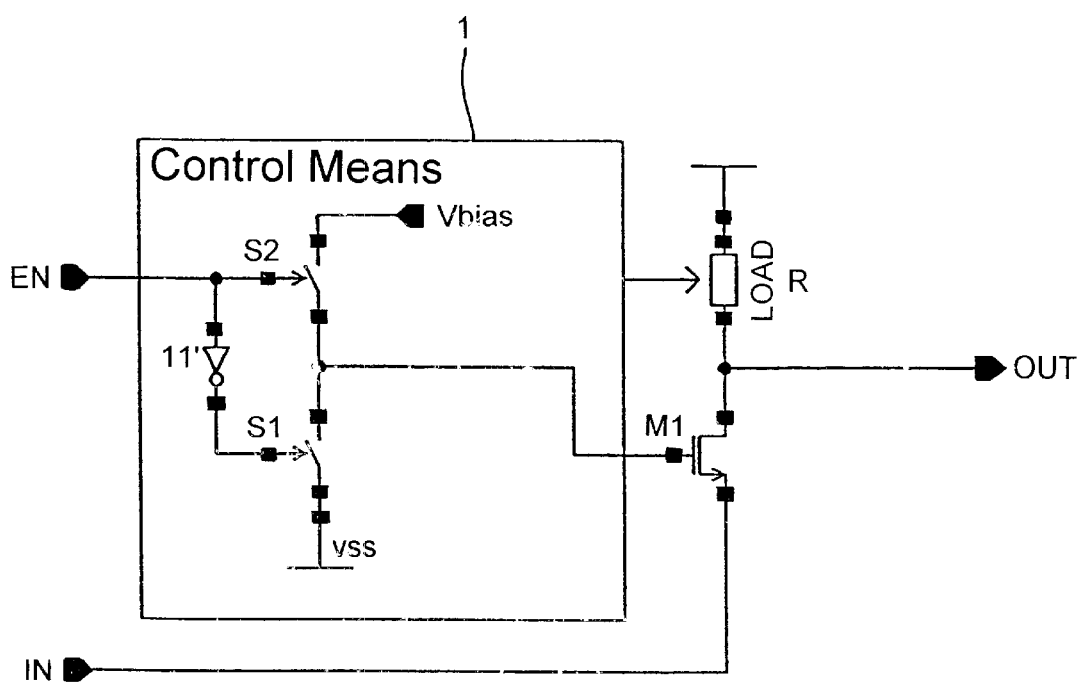
FIGS. 12 to 19 are circuit diagrams illustrating different control arrangements for the pass transistor of the pass gate of FIG. 6.

FIG. 12 illustrates in more detail part of the control means 1 for controlling the pass transistor M1. The control means 1 includes a bias voltage generator for generating the bias voltage $V_{bias}$. The enable input EN is connected so as to control a switch S2. The enable input EN is also connected to the input of an inverter I1' whose output controls another switch S1. The switches S1 and S2 are connected between the source of the bias voltage $V_{bias}$ and the supply line vss with the connection between the switches S1 and S2 being connected to the gate of the pass transistor M1.

When the enable signal is active, the switch S2 is closed whereas the switch S1 is open so that the bias voltage $V_{bias}$ is supplied to the gate of the transistor M1, which functions as a common gate amplifier as described hereinbefore. When the enable signal is inactive, the switch S2 is open whereas the switch S1 is closed and connects the gate of the transistor M1 to the supply line vss. The transistor M1 is thus turned off irrespective of the input signal at input IN and isolates the output OUT from the input IN.

Figure 13:
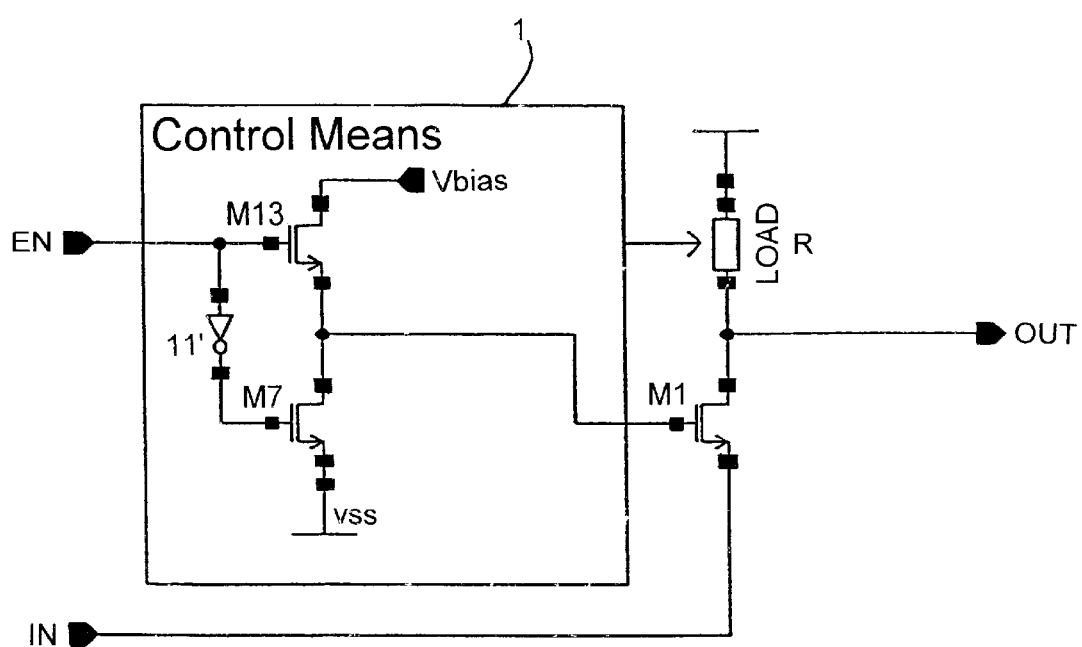

FIG. 13 illustrates an embodiment of the pass gate of FIG. 12 in which the switches S1 and S2 are implemented as N-type field effect transistors M7 and M13. The operation of the pass gate shown in FIG. 13 is the same as described hereinbefore with reference to FIG. 12.

Figure 14:
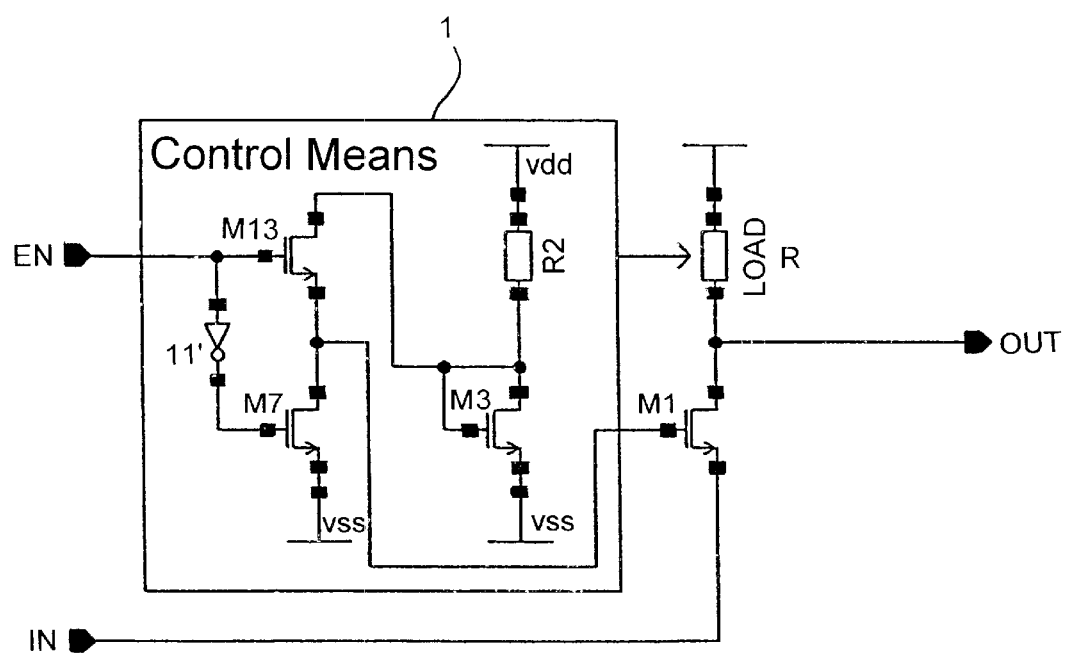

FIG. 14 illustrates a bias voltage generating arrangement in a pass gate of the type shown in FIG. 13. The bias voltage generator comprises an N-type field effect transistor M3 whose source is connected to the supply line vss and whose gate and drain are connected via a resistor R2 to the supply line vdd and form the output of the bias voltage generator connected to the drain of the transistor M13. The transistor M3 operates in its saturated conductive regime and the current $I_{DS}$ through the drain-source path of the transistor M3 is given by:

$$I_{DS} = \frac{\beta_n}{2}(V_{GS} - V_{Tn})^2$$

Where $\beta_n$ is the (geometry dependent) transconductance parameter of the transistor M3, $V_{GS}$ is the gate-source voltage of the transistor M3 and $V_{Tn}$ is the threshold voltage of the transistor M3. The bias voltage $V_{bias}$ generated at the drain of the transistor M3 is given by:

$$V_{bias} = V_{Tn} + \frac{\sqrt{1 + 2\beta_n R_2(V_{DD} - V_{Tn})} - 1}{\beta_n R_2}$$

By appropriately choosing the drive strength of the transistor M3 and the value of the resistor R2, it is possible to set the bias voltage $V_{bias}$ to any value between the threshold voltage $V_{Tn}$ (for values of R2 approaching infinity) and the supply line voltage $V_{DD}$ (corresponding to the resistor R2 having zero resistance). If the transistor M3 has the same threshold voltage as the transistor M1 and if the value of the resistor R2 is made sufficiently large, the transistor M1 can be biased just above its threshold so as to satisfy criteria 1 and 2 described hereinbefore.

Figure 15:
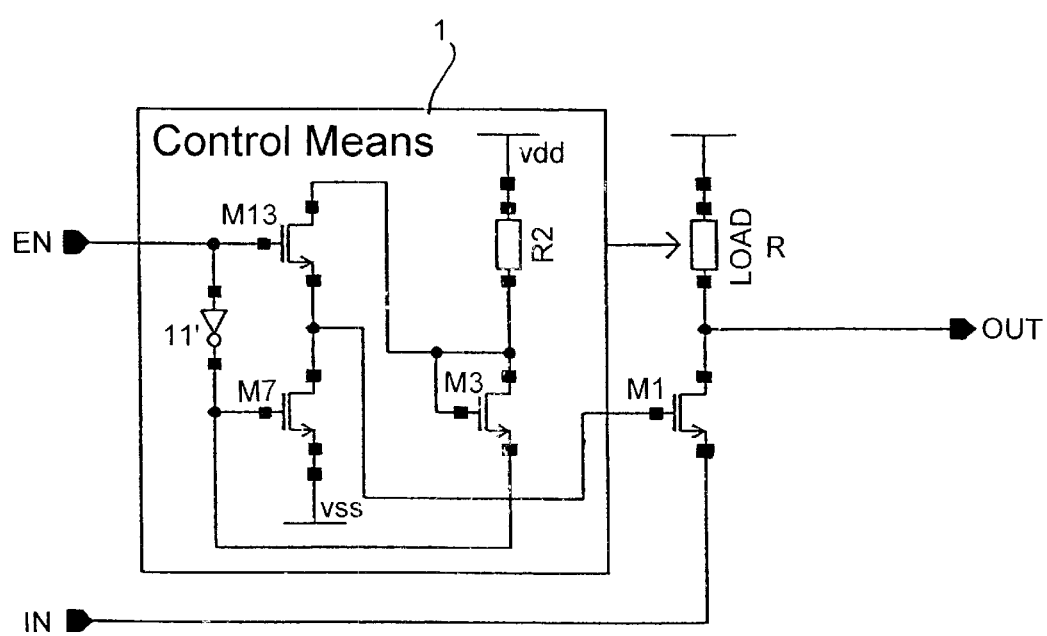

The pass gate shown in FIG. 15 differs from that shown in FIG. 14 in that the source of the transistor M3 is connected to the output of the inverter I1' instead of to the supply line vss. This arrangement ensures that, when the enable signal is inactive, the source of the transistor M3 is pulled to the supply line voltage $V_{DD}$ so that current flow in the bias generator is cut off and the power consumption of the pass gate is reduced. However, when the inverter I1' is embodied as the standard two transistor CMOS inverter, the source of the transistor M3 is connected to ground via an N-type transistor when the enable signal is active. Depending on the drive capability of the N-type transistor of the inverter I1' in relation to that of the transistor M3 and the value of the resistor R2, the source of the transistor M3 may therefore be raised to a small positive bias value when the enable signal is active. This offset may be useful in optimising the pass gate for some configurations.

Figure 16:
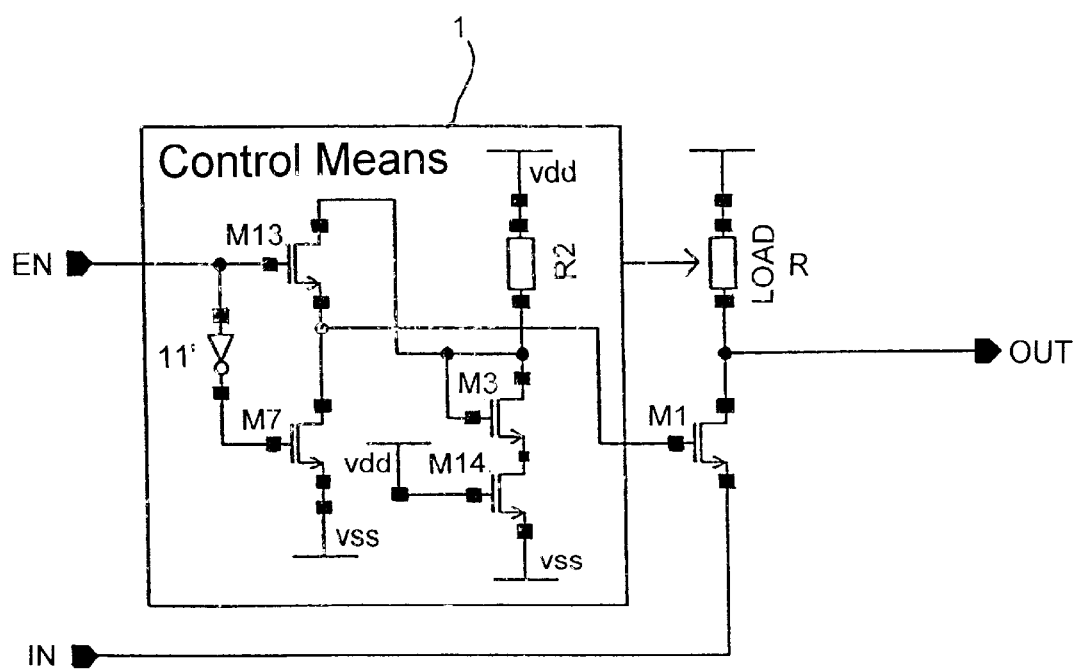

The pass gate of FIG. 16 achieves a similar result by connecting the source-drain path of an N-type transistor M14 between the source of the transistor M3 and the supply line vss. The gate of the transistor M14 receives a bias voltage and is shown connected to the supply line vdd for this purpose. Alternatively, the gate of the transistor M14 may be connected to the input EN. The transistor M14 supplies a small bias voltage which is added to the bias voltage provided by the transistor M3 and the resistor R2 so that a higher bias voltage $V_{bias}$ is provided. This may simplify circuit design and optimisation.

If the value of the resistor R2 is made equal to the value of the load R and the transistors M1 and M3 have identical drive capabilities, the transistor M1 cannot pull the output OUT down to a voltage which is less than the bias voltage $V_{bias}$. This means that, for good level shifting, the bias voltage $V_{bias}$ must be small but, in order to generate the bias voltage with active load devices, the transistors M1 and M3 may have to be much larger than the active load devices. By applying the small bias voltage generated by the transistor M14 to the source of the transistor M3, the transistor M1 is able to pull the output OUT down to a voltage which is lower than the bias voltage $V_{bias}$. This arrangement therefore relieves the requirement for wide devices in the pass gate.

Figure 17:
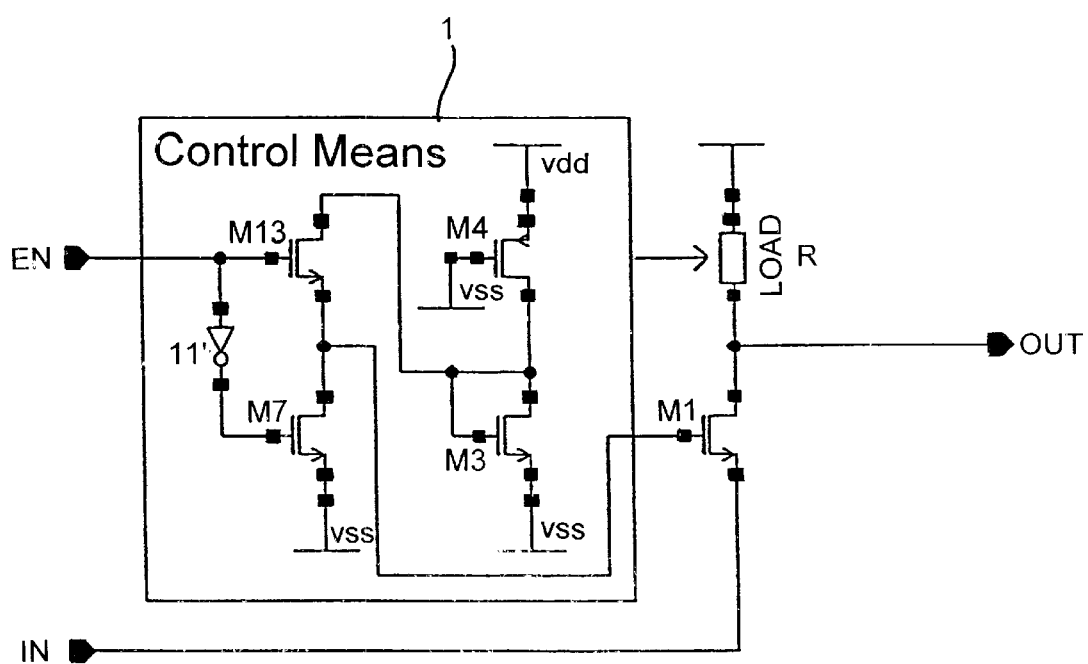

The pass gate shown in FIG. 17 is of the type shown in FIG. 14 with the resistor R2 embodied as a P-type field effect transistor M4. The gate of the transistor M4 receives a bias voltage and, for convenience as shown in FIG. 17, may be connected to the supply line vss. In this case, the transistor M4 operates in its linear conduction regime with the drain-source current being given by:

$$I_{DS} = \beta_P \left[ (V_{GS} - V_T)V_{DS} - \frac{V_{DS}^2}{2} \right].$$

Where $\beta_p$ is the (geometry dependent) transconductance parameter, $V_{GS}$ is the source-gate voltage, $V_T$ is the threshold voltage and $D_{GT}$ is the threshold voltage and $V_{DS}$ is the drain-source voltage. If the transistors M3 and M4 have substantially the same threshold voltage $V_T$, the bias voltage $V_{bias}$ generated at the drain of the transistor M3 is given by:

$$V_{bias} = V_T + \sqrt{V_T^2 + \frac{\beta_p(V_{DD}^2 - 2V_T V_{DD}) - \beta_n V_T^2}{\beta_n + \beta_p}}.$$

For threshold voltages substantially smaller than the supply voltage $V_{DD}$, this may be simplified to:

$$V_{bias} = \frac{\beta_p}{\beta_p + \beta_n} V_{DD}.$$

The value of the bias voltage $V_{bias}$ thus depends on the ratio of the drive capabilities of the transistors M3 and M4. If the transistors have substantially identical value of $\beta$, then, for typical values of $V_{Dd}$ and $V_T$, the bias voltage tends to be greater than $V_{DD}/2$. Further, the higher the drive capability of the transistor M3 with respect to the transistor M4, the lower the value of the bias voltage $V_{bias}$ becomes. This is advantageous in order to satisfy the criteria defined hereinbefore.

Figure 18:
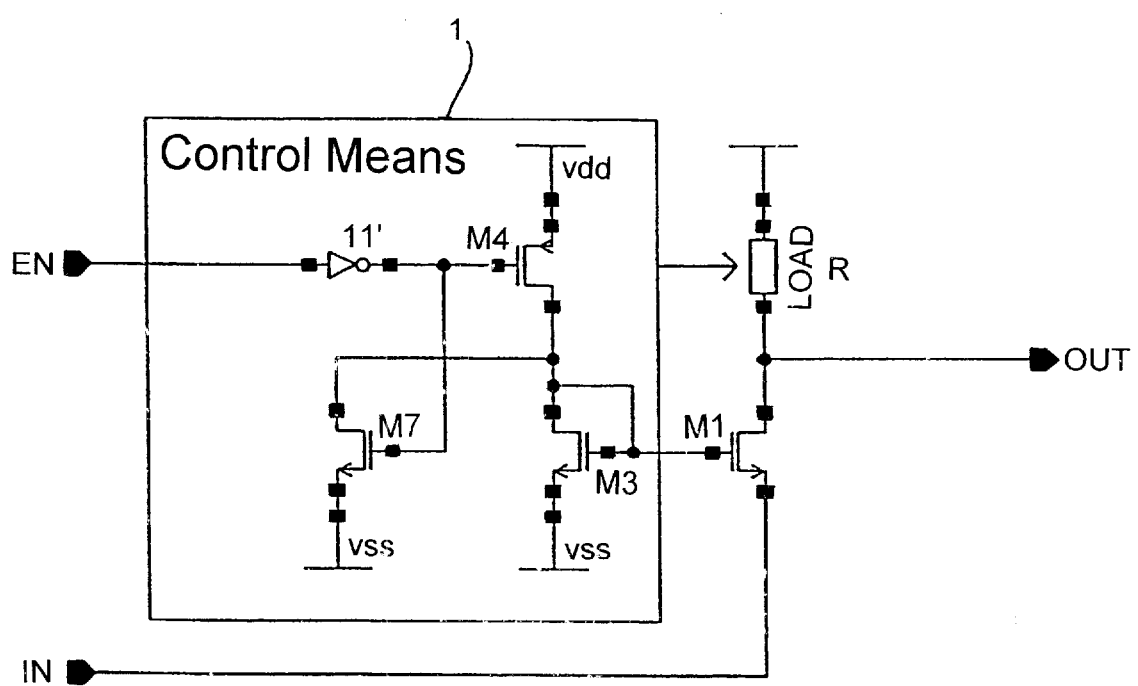

The pass gate shown in FIG. 18 differs from that shown in FIG. 17 in that the transistor M13 is omitted, the gate of the transistor M4 is connected to the output of the inverter I1', and the drain of the transistor M7 is connected to the output of the bias voltage generator ie the connection between the drains of the transistors M4 and M3. When the enable signal supplied to the enable input EN is active, the output of the inverter I1' pulls the gates of the transistors M4 and M7 to the lower supply potential $V_{SS}$. The transistor M7 is turned off and the transistor M4 is turned on to provide the bias voltage generator load. The required bias voltage is thus supplied to the gate of the pass transistor M1 and the pass gate functions as described hereinbefore for high and low input logic levels.

When the enable signal is inactive, the output of the inverter I1' pulls the gate of the transistors M4 and M7 to the upper supply line voltage $V_{DD}$. The transistor M4 is thus turned off and the gates of the transistors M1 and M3 are connected to the lower supply line vss. The bias voltage generator is thus disabled and the pass transistor M1 is turned off.

Figure 19:
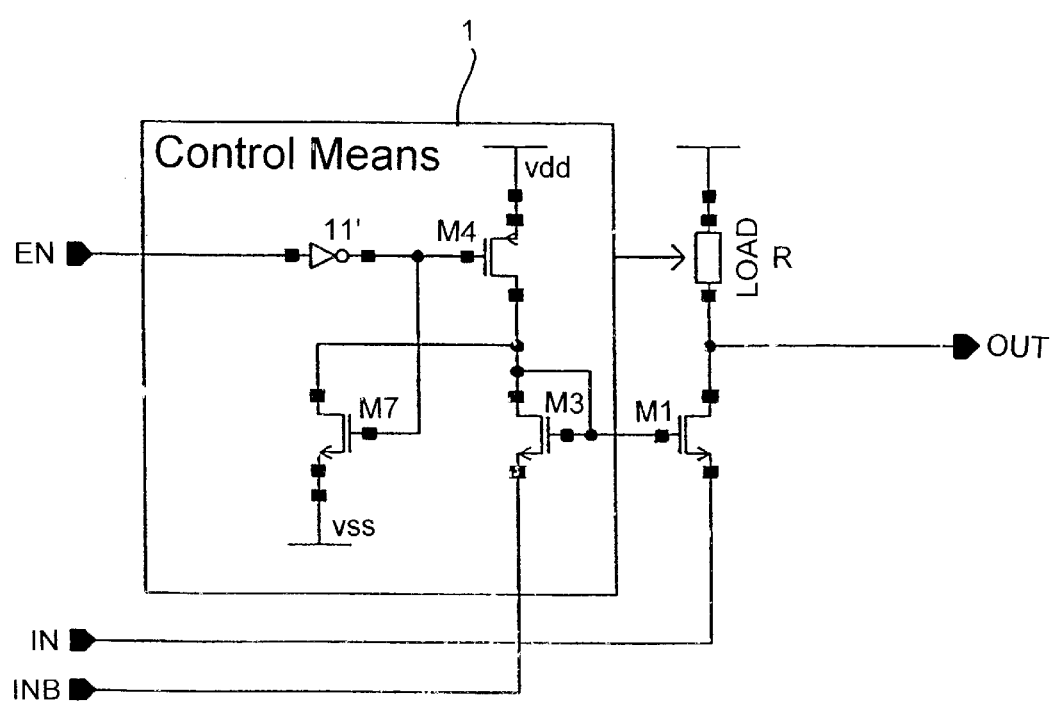

The pass gate shown in FIG. 19 differs from that shown in FIG. 18 in that the source of the transistor M3 is connected to a complementary signal input INB. When the enable signal is inactive, the transistor M7 connects the gates of the transistors M1 and M3 to the lower supply line vss. The transistors M1 and M3 are thus turned off so that the inputs IN and INB are isolated and assume a high impedance state.

When the enable signal is active, the pass gate of FIG. 19 operates in the manner described hereinbefore when the input signal at the input IN is at the upper input logic level so that the complementary input signal at the input INB is at the lower input logic level ie at $V_{SS}$. However, when the input IN is at the lower input logic level and the input INB is at the higher input logic level $V_{HH}$, the value of the bias voltage supplied to the gate of the transistor M1 is approximately increased by an amount equal to $V_{HH}$. The resulting increase in the gate-source voltage of the transistor M1 further lowers the voltage at the output OUT of the pass gate. Thus, a larger degree of voltage swing may be provided at the output OUT by using complementary input signals and the configuration illustrated in FIG. 19.

Figure 20:
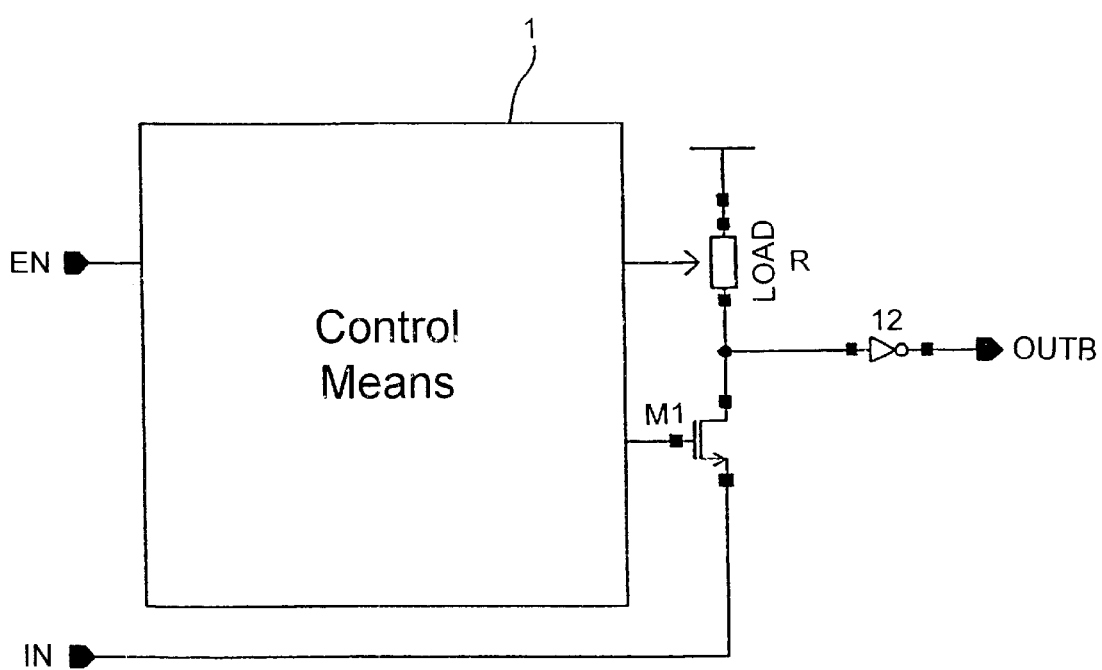
FIGS. 20 and 21 are schematic circuit diagrams illustrating the use of an output inverter with the pass gate of FIG. 6.

As shown in FIG. 20, the output of the pass gate may be supplemented or buffered by an inverter I2, which thus provides an inverted output signal at the output OUTB. The input signal to the inverter I2 switches between levels above and below the switching point of the inverter I2. However, for speed considerations as described hereinbefore, these logic levels may be less than the voltage extremes defined by the supply voltages $V_{SS}$ and $V_{DD}$. The use of the inverter I2, which acts as a simple "hard limiter", provides output voltage levels which are almost equal to the supply voltages. The inverter I2 may be the standard two transistor CMOS inverter configuration.

Figure 21:
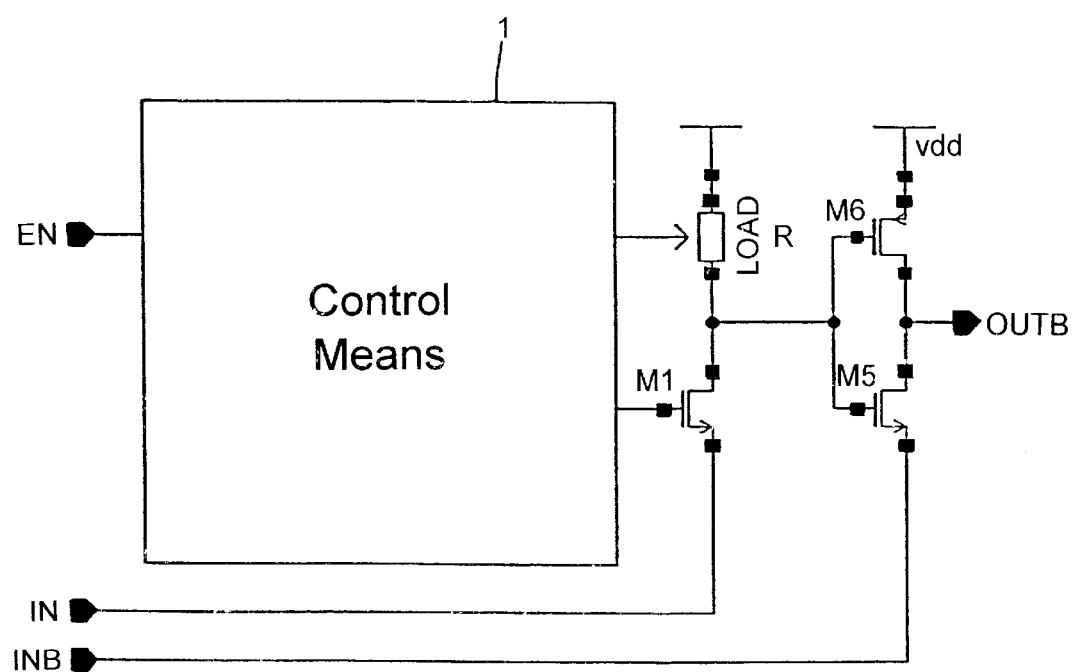

The pass gate shown in FIG. 21 differs from that shown in FIG. 20 in that the inverter I2, which is embodied as the standard CMOS inverter comprising an N-type transistor M5 and a P-type transistor M6, has the source of the transistor M5 connected to a complimentary input INB.

When the pass gate is enabled and the signal at the input IN is at the input logic high level, the complementary input INB is substantially at the lower supply line potential and the inverter comprising the transistors M5 and M6 operates in the conventional way. However, when the signal supplied to the input IN is at the lower input logic level, the signal at the complementary input INB is at the higher input logic level $V_{HH}$. The gate-source voltage of the transistor M5 is thus reduced and this provides a larger voltage swing at the output OUTB of the inverter.

Figure 22:
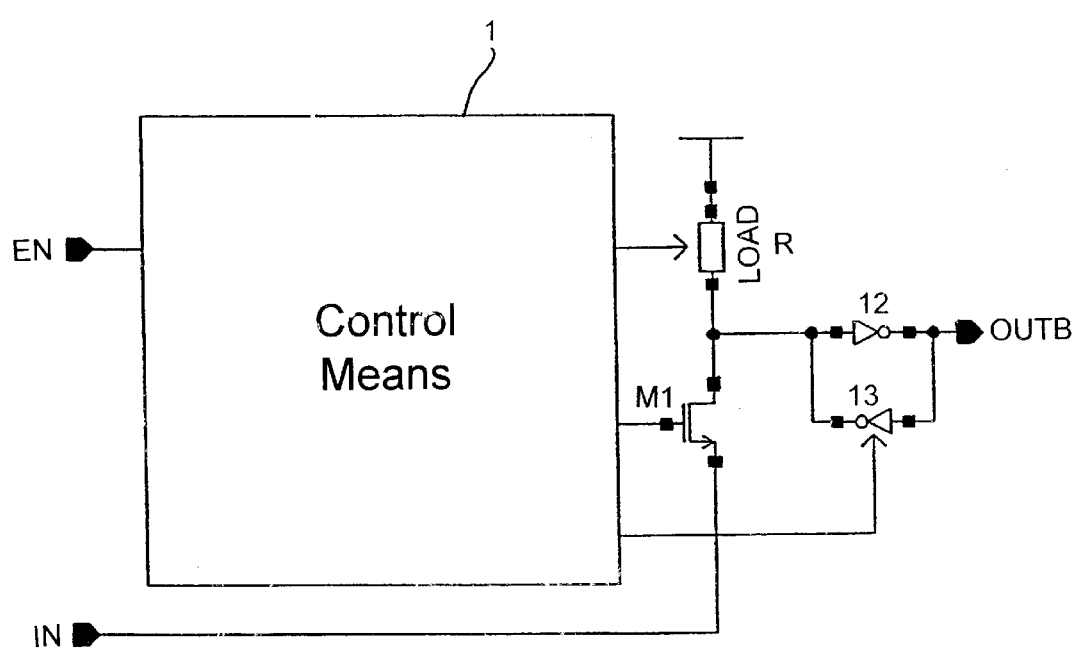
FIGS. 22 and 23 are schematic circuit diagrams illustrating a latching arrangement which may be used with the pass gate of FIG. 6.

The pass gate shown in FIG. 22 differs from that shown in FIG. 20 in that a further inverter I3 has its input and output connected to the output and input, respectively, of the inverter I2. Also, the inverter I3 is controllable and is controlled by the control means 1. The inverter I3 thus functions as a feedback inverter which can be disabled by a control signal from the control means 1.

When the enable signal is active, the control means disable the inverter I3 so that the pass gate functions in the same way as the pass gate shown in FIG. 20. However, when the enable signal is inactive, the pass transistor M1 is switched off and the load R is chosen so that the output of the pass gate connected to the input of the inverter I2 defaults to a high impedance state, for example as illustrated by the load arrangement in FIG. 8. The feedback inverter I3 is activated by the control means 1 and, together with the inverter I2, forms a latching mechanism. This arrangement therefore operates as a simple low voltage sample-and-hole circuit which samples the input signal when the enable signal is active and holds the signal when the enable signal becomes inactive.

Figure 23:
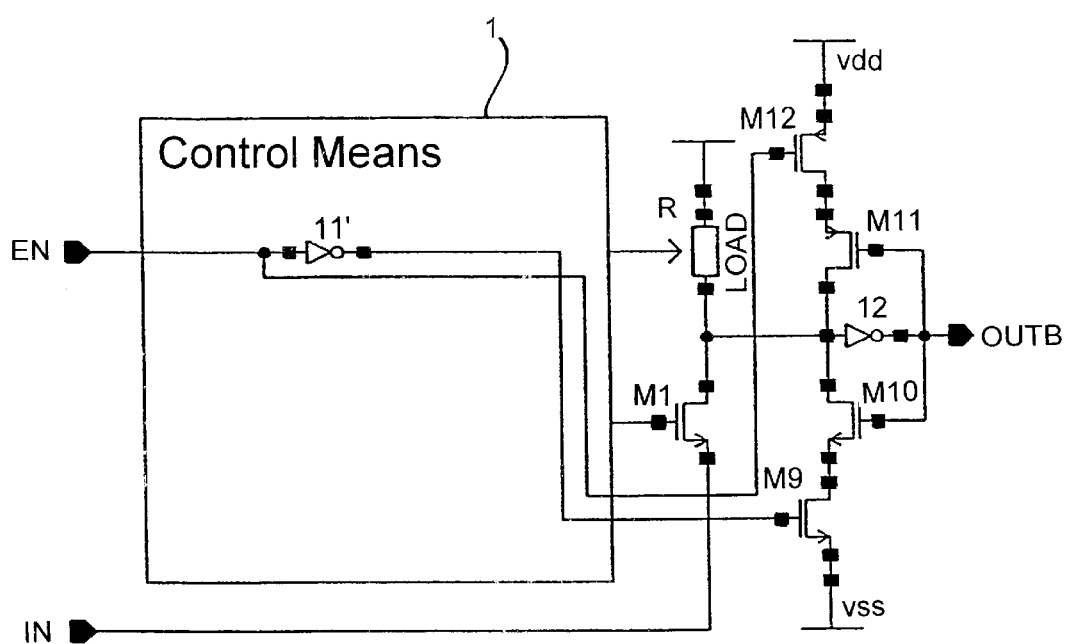

FIG. 23 illustrates a particular example of the inverter I3, which comprises N-type transistors M9 and M10 and P-type transistors M11 and M12, whose source-drain paths are connected in series between the supply lines vss and vdd. The transistors M10 and M11 are the conventional "inverter transistors" whereas the transistors M9 and M12 are control transistors whose gates are connected to the output and input, respectively, of the inverter I1' of the control means 1. When the enable signal is active, the transistors M9 and M12 are turned off so that the transistors M10 and M11 are isolated from the power supply and the inverter I3 is disabled. When the enable signal is inactive, the transistors M9 and M12 are turned on so that the inverter I3 functions in the normal way.

The order of the transistors M9 and M10 and the order of the transistors M11 and M12 may be changed without affecting the operation of the controllable inverter. Also, the pairs of transistors M9, M10 and M11, M12 may be implemented as dual gate MOSFETs. Also, the transistors M9 and M12 may be omitted provided that the drive capability of the first level shifting stage comprising the transistor M1 and the load R is greater than that of the transistors M10 and M11.

Figure 24:
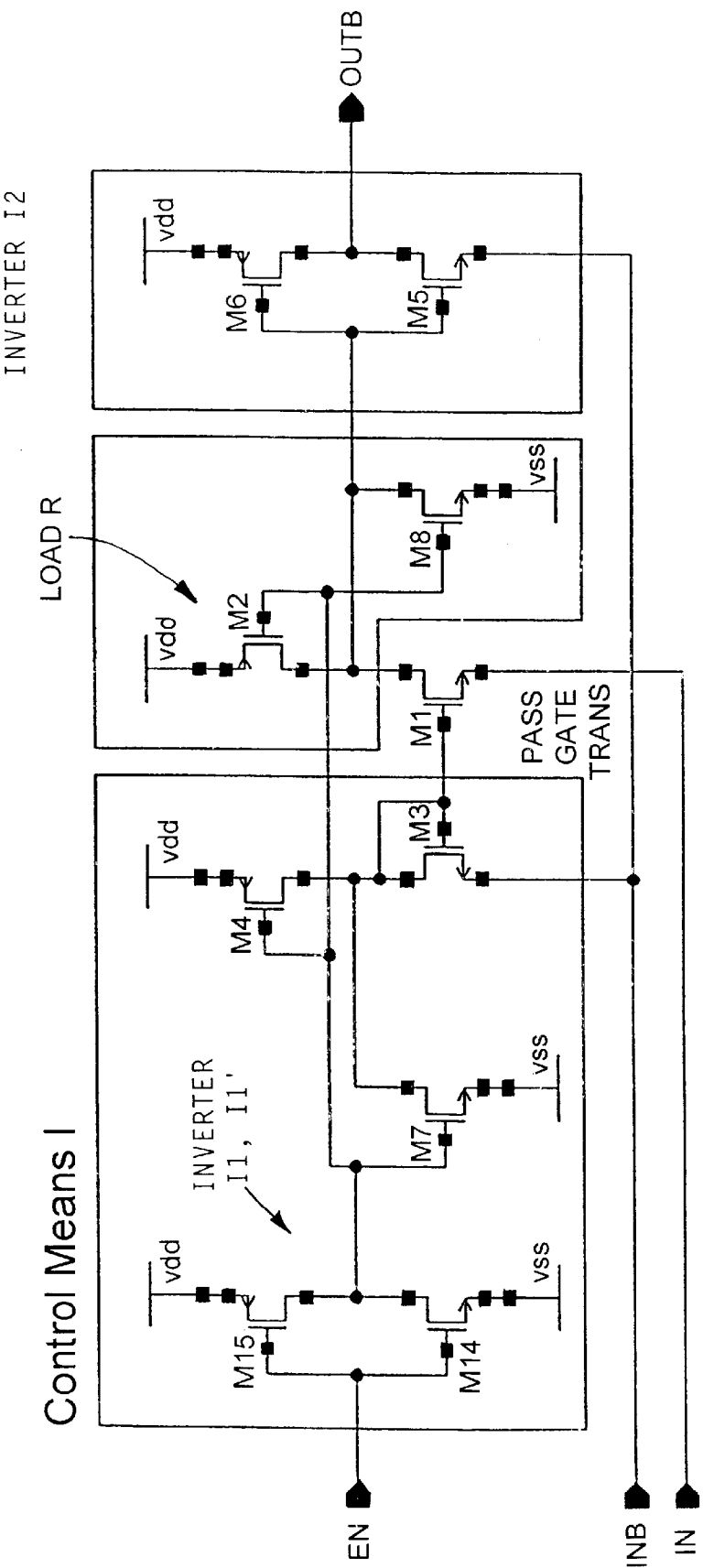
FIG. 24 is a circuit diagram illustrating a pass gate constituting another embodiment of the invention.

The pass gate shown in FIG. 24 comprises the load arrangement shown in FIG. 11, the bias voltage generator shown in FIG. 19 and the output inverter arrangement shown in FIG. 21. The inverters I1 and I1' are constituted by a single inverter formed by the conventional CMOS inverter arrangement comprising an N-type transistor M14 and a P-type transistor M15. The output OUTB of the level-shifting pass gate thus defaults to the upper logic level $V_{DD}$ when the enable signal at the enable input EN is at the inactive or low logic level state $V_{SS}$.

Figure 25:
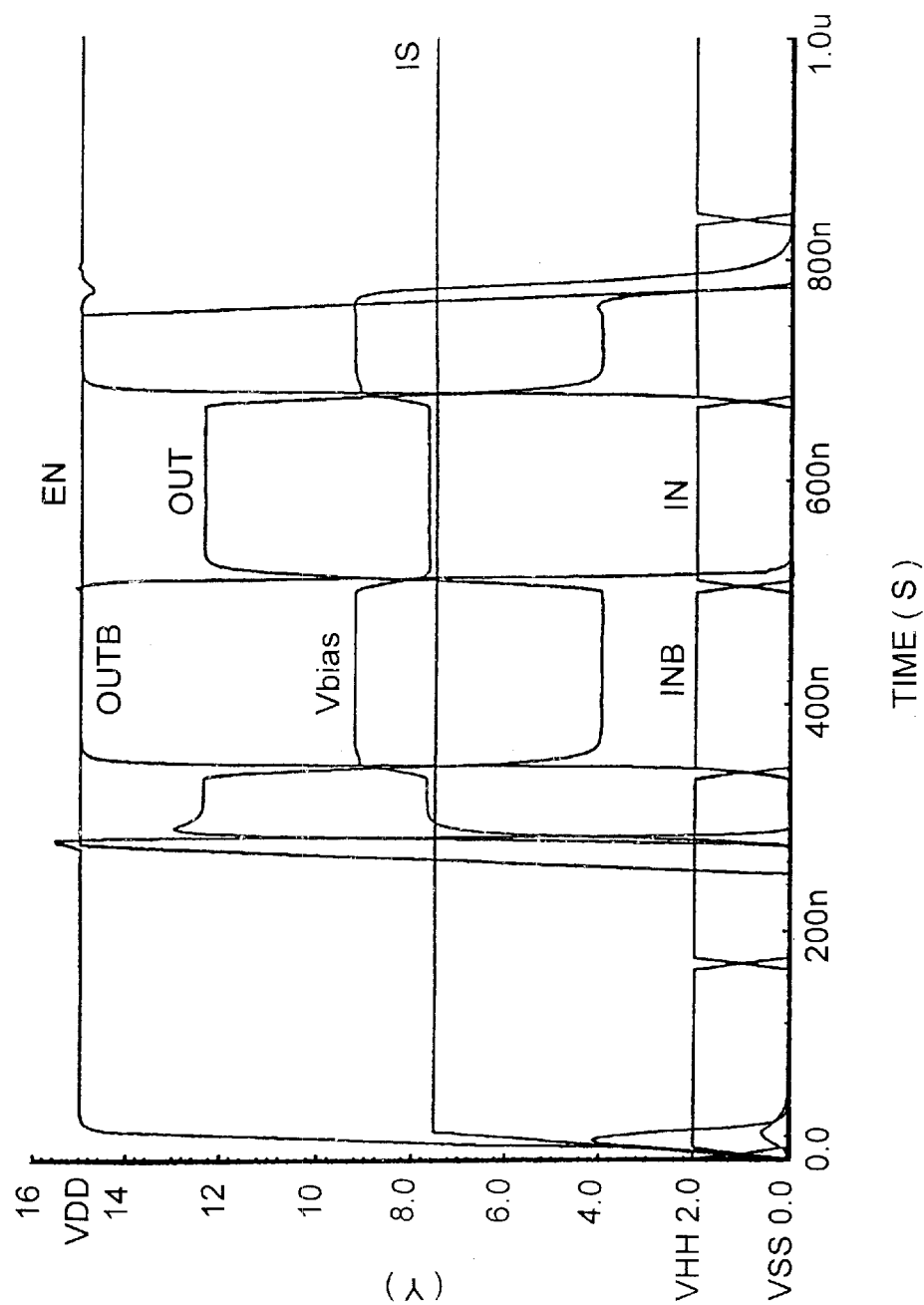
FIGS. 25 and 26 are waveform diagrams illustrating waveforms occurring in a simulation of the pass gate of FIG. 24.
Figure 26:
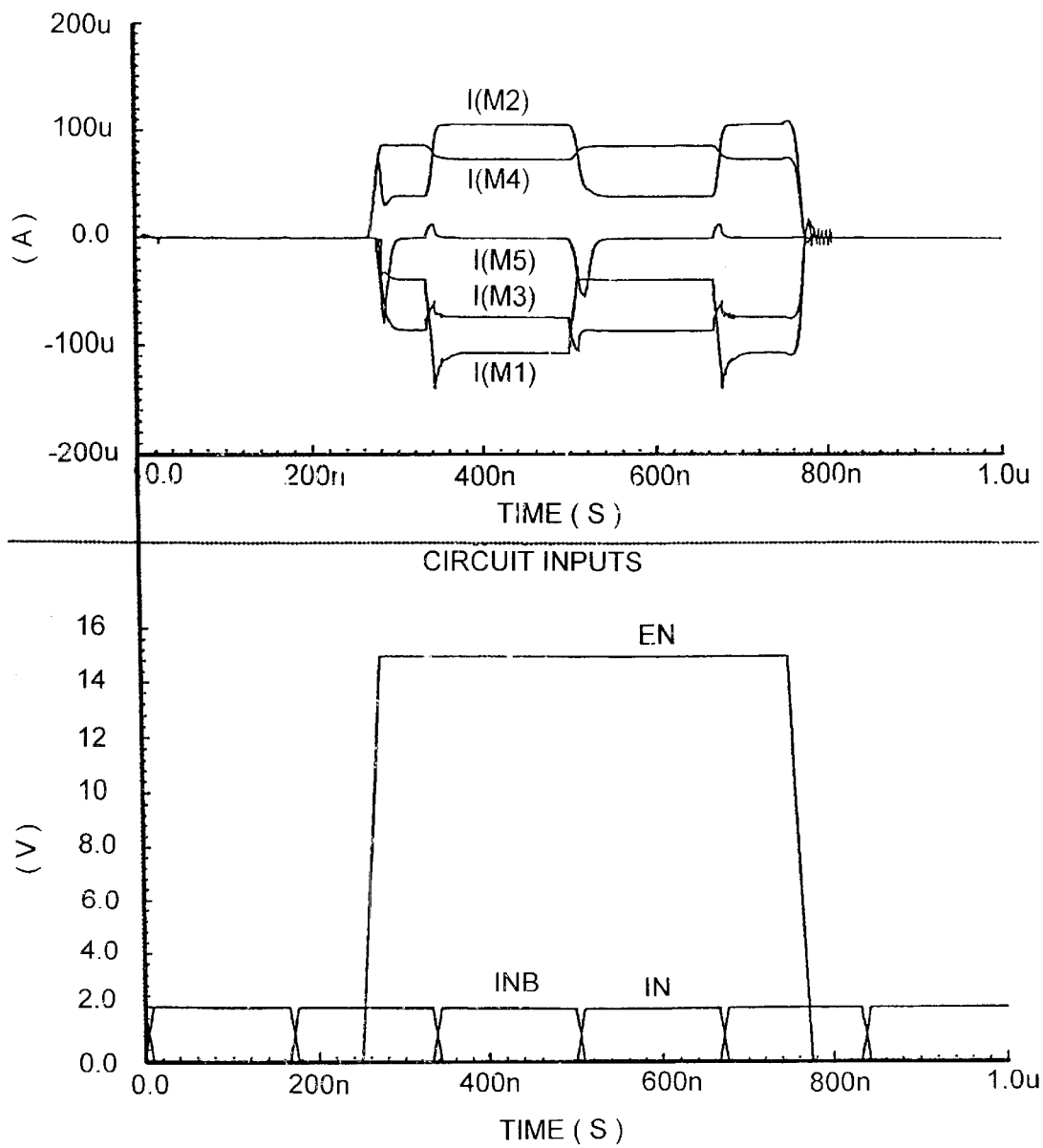

FIGS. 25 and 26 illustrate the waveforms occurring in a simulation of the pass gate of FIG. 24 in which $V_{HH}$ is 2 volts, $V_{DD}$ is 15 volts and the transistors have performances which are typical of low-temperature poly-silicon thin-film transistors with a threshold voltage of 2 volts and β of 1.25 $\mu A/V^2$ for square devices. The transistors M1 and M3 are three times wider than the remaining transistors in FIG. 24 which are all square devices. The lower graph of FIG. 26 illustrates the input signals supplied to the inputs IN and INB and the enable signal supplied to the enable input EN. The input signals are 3 MHz signals with an amplitude of 2 volts. The resulting transient currents I for the transistors M1 to M5 are illustrated in the upper graph of FIG. 26.

As shown in FIG. 25, the signal at the output OUT switches cleanly to either side of the input switching voltage IS of the inverter I2. The inputs signals are level-shifted to within 10 millivolts of the supply line voltages $V_{DD}$ and $V_{SS}$.

Figure 27:
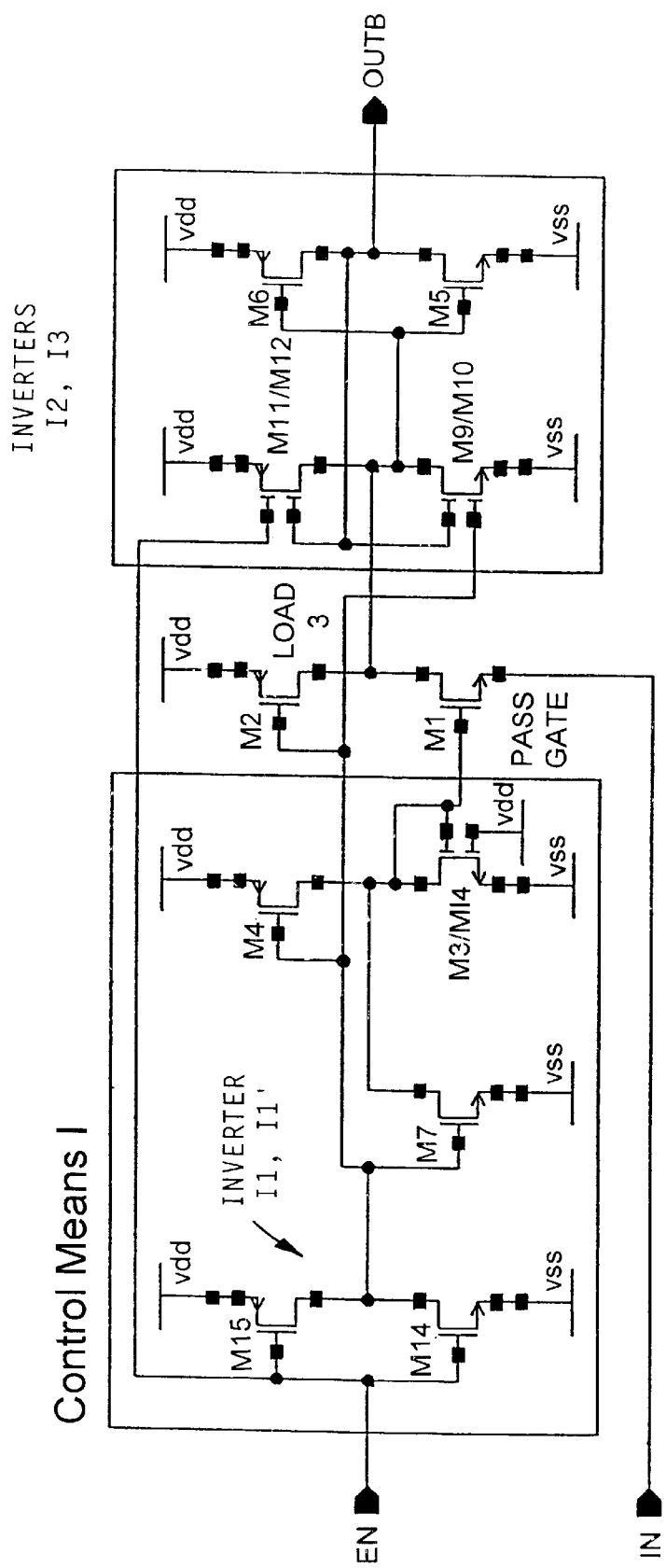
FIG. 27 is a circuit diagram of a pass gate constituting a further embodiment of the invention.
Figure 28:
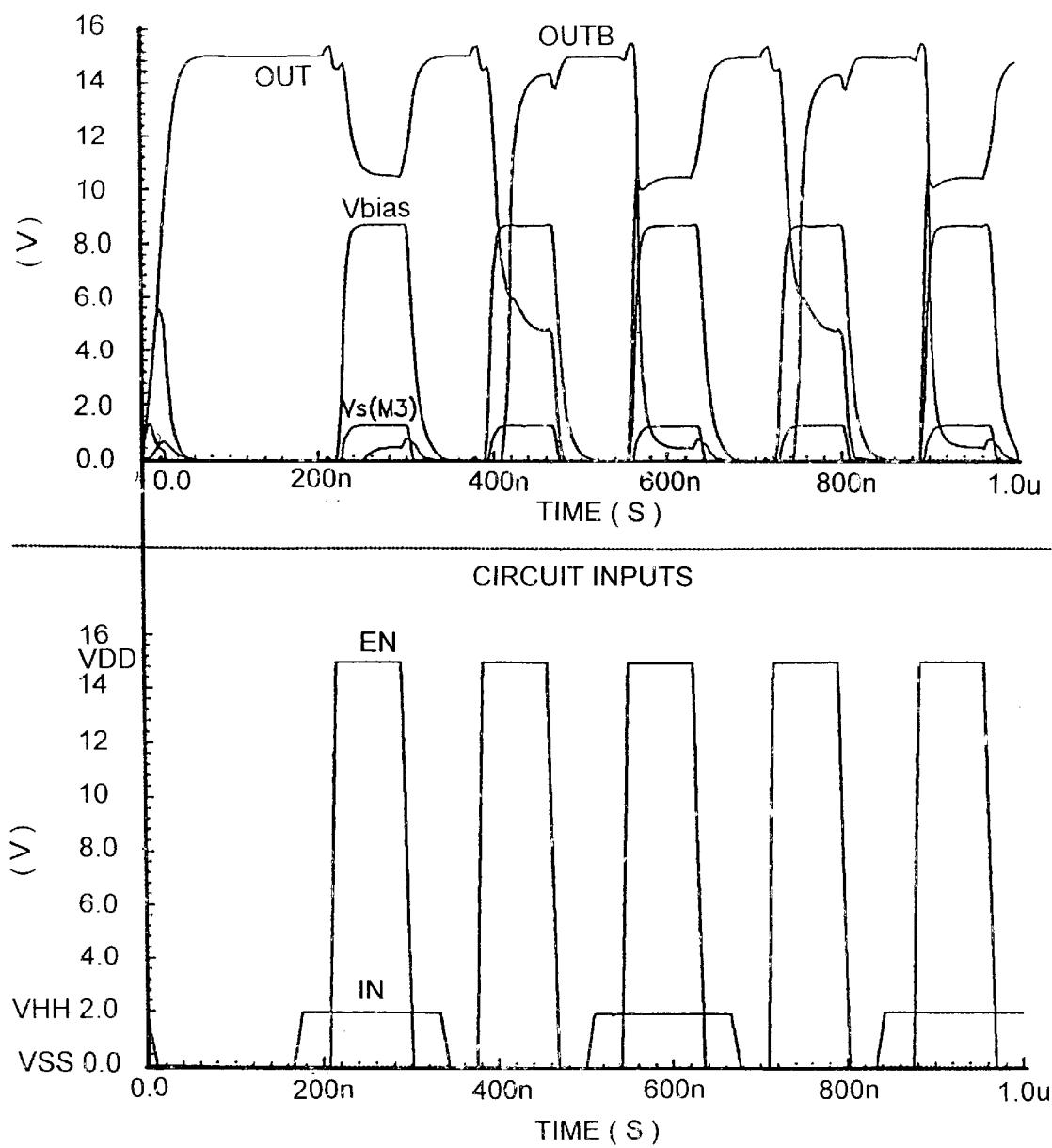
FIG. 28 is a waveform diagram illustrating waveforms occurring in a simulation of the pass gate of FIG. 27.

FIG. 27 illustrates a pass gate for low voltage data sampling with a single-ended input IN. The pass gate of FIG. 27 comprises the load arrangement illustrated in FIG. 8, the bias voltage generator illustrated n FIG. 18 with the bias voltage generating transistor arrangement illustrated in FIG. 16 and the transistors M3 and M14 combined as a dual gate transistor, and the output inverter arrangement illustrated in FIG. 23 with the pairs of transistors M9, M10 and M11, M12 embodied as dual gate transistors. FIG. 28 illustrates the waveforms occurring in a simulation of the pass gate of FIG. 27 using the same parameters as described hereinbefore and again illustrates that excellent level-shifting performance may be achieved with relatively poor performance poly-silicon thin-film transistors, for example as found in monolithic driver circuitry for flat-panel matrix displays.

It is thus possible to provide a level-shifting pass gate which provides a high degree of level-shifting combined with good performance from a relatively simple circuit. The pass gate can be enabled or disabled and, in the disabled state, the or each signal input presents a high impedance to any signal line to which it is connected Also, in the disabled state, the output is arranged to default to any desired condition.

What is claimed is:

1. A level-shifting pass gate comprising: a first circuit comprising a pass transistor, whose main conduction path is connected between a signal input and a signal output, and a load connected to the signal output; and a second circuit having an enable input and being arranged to control the first circuit such that: when an enable signal supplied to the enable input is active and a first logic level is supplied to the signal input, the pass transistor provides a level-shifted logic level at the signal output; when the enable signal is active and a second logic level is supplied to the signal input, the pass transistor provides the second logic level at the signal output substantially unshifted; and, when the enable signal is inactive, the signal input is set to a high impedance state and the signal output is set to a predetermined state.

2. A gate as claimed in claim 1, in which the first logic level has a higher magnitude than the second logic level.

3. A gate as claimed in claim 2, in which the magnitude of the second logic level is substantially equal to zero.

4. A gate as claimed in claim 1, in which the second circuit is arranged to switch off the pass transistor when the enable signal is inactive.

5. A gate as claimed in claim 1, in which the second circuit is arranged to supply, to a control electrode of the pass transistor, a bias voltage greater than a threshold voltage of the pass transistor when the enable signal is active.

6. A gate as claimed in claim 5, in which the difference between the bias voltage and the first logic level is less than the threshold voltage of the pass transistor.

7. A gate as claimed in claim 5, in which the second circuit comprises a bias voltage source comprising a resistance connected to an output electrode and a control electrode of a first transistor.

8. A gate as claimed in claim 7, in which the first transistor has a common electrode connected to ground.

9. A gate as claimed in claim 7, in which the first transistor has a common electrode connected to receive a high voltage level when the enable signal is inactive and a low voltage level when the enable signal is active.

10. A gate as claimed in claim 7, in which the first transistor has a common electrode connected to a complementary signal input.

11. A gate as claimed in claim 8, in which the common electrode of the first transistor is connected via the main conduction path of a second transistor whose control electrode is arranged to receive a further bias voltage.

12. A gate as claimed in claim 9, in which the common electrode of the first transistor is connected via the main conduction path of a second transistor whose control electrode is arranged to receive a further bias voltage.

13. A gate as claimed in claim 10, in which the common electrode of the first transistor is connected via the main conduction path of a second transistor whose control electrode is arranged to receive a further bias voltage.

14. A gate as claimed in claim 7, in which the resistance comprises the main conduction path of a third transistor.

15. A gate as claimed in claim 14, in which the third transistor is arranged to be switched off when the enable signal is inactive and to be conductive when the enable signal is active.

16. A gate as claimed in claim 7, in which the control and output electrodes of the first transistor are connected to a control electrode of the pass transistor.

17. A gate as claimed in claim 1, comprising a fourth transistor arranged to connect a control electrode of the pass transistor to ground when the enable signal is inactive.

18. A gate as claimed in claim 1, comprising at least one further pass transistor, the or each of which has a main conduction path connected between a respective further signal input and the signal output.

19. A gate as claimed in claim 1, in which the load comprises a substantially fixed resistance and the predetermined state comprises a high level state.

20. A gate as claimed in claim 1, in which the load comprises a load transistor of a conductivity type opposite that of the pass transistor.

21. A gate as claimed in claim 20, in which the pass transistor has a higher drive capability than the load transistor.

22. A gate as claimed in claim 20, in which the load transistor is arranged to be switched off when the enable signal is inactive.

23. A gate as claimed in claim 22, in which the predetermined state is a high impedance state.

24. A gate as claimed in claim 22, in which a pull-down transistor having a main conduction path connected between the signal output and ground is arranged to be switched on when the enable signal is inactive and the predetermined state is a low level state.

25. A gate as claimed in claim 22, in which the load transistor is arranged to receive a fixed bias and the predetermined state is a high level state.

26. A gate as claimed in claim 25, in which the load transistor has a control electrode arranged to receive a ground potential.

27. A gate as claimed in claim 1, in which the signal output is connected to the input of a first inverter.

28. A gate as claimed in claim 27, comprising a second controllable inverter whose input and output are connected to the output and input, respectively, of the first inverter and which is arranged to be enabled when the enable signal is inactive and to be disabled when the enable signal is active.

29. A level-shifting pass gate comprising: a first circuit comprising a pass transistor, whose main conduction path is connected between a signal input and a signal output, and a load connected to the signal output; and a second circuit having an enable input and being arranged to control the first circuit such that, when an enable signal supplied to the enable input is active and a first logic level is supplied to the signal input, the pass transistor provides a level-shifted logic level at the signal output and, when the enable signal is inactive, the signal input is set to a high impedance state and the signal output is set to a predetermined state; wherein the transistor comprises a field effect transistor.

30. A gate as claimed in claim 29, embodied in a CMOS integrated circuit.

31. A driver circuit for a matrix display including a gate as claimed in claim 1.

32. A driver circuit for a matrix display including a gate as claimed in claim 29.

* * * * *